(12) United States Patent
Lee et al.

(10) Patent No.: US 11,705,420 B2
(45) Date of Patent: Jul. 18, 2023

(54) MULTI-BUMP CONNECTION TO INTERCONNECT STRUCTURE AND MANUFACTURING METHOD THEREOF

(71) Applicant: Taiwan Semiconductor Manufacturing Co., Ltd., Hsinchu (TW)

(72) Inventors: Tsung-Yen Lee, Hemei Township (TW); Chia-Kuei Hsu, Hsinchu (TW); Shang-Lun Tsai, Hsinchu (TW); Ming-Chih Yew, Hsinchu (TW); Po-Yao Lin, Zhudong Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 174 days.

(21) Appl. No.: 17/178,460

(22) Filed: Feb. 18, 2021

(65) Prior Publication Data

US 2022/0139860 A1 May 5, 2022

Related U.S. Application Data

(60) Provisional application No. 63/107,055, filed on Oct. 29, 2020.

(51) Int. Cl.
*H01L 21/00* (2006.01)
*H01L 23/00* (2006.01)
*H01L 25/065* (2023.01)

(52) U.S. Cl.
CPC ............ *H01L 24/14* (2013.01); *H01L 24/02* (2013.01); *H01L 24/11* (2013.01); *H01L 24/13* (2013.01); *H01L 25/0652* (2013.01); *H01L 2224/0235* (2013.01); *H01L 2224/02311* (2013.01); *H01L 2224/02331* (2013.01); *H01L 2224/02381* (2013.01); *H01L 2224/1147* (2013.01); *H01L 2224/13014* (2013.01); *H01L 2224/1411* (2013.01); *H01L 2225/06517* (2013.01)

(58) Field of Classification Search
CPC ........... H01L 24/14; H01L 24/02; H01L 24/11
See application file for complete search history.

(56) References Cited

U.S. PATENT DOCUMENTS 6,982,487 B2 * 1/2006 Kim .................. H01L 23/49816
257/737
9,391,043 B2 * 7/2016 Paek ....................... H01L 24/14
(Continued)

FOREIGN PATENT DOCUMENTS

CN  111834326 A * 10/2020 ......... H01L 21/4853
CN  113594046 A * 11/2021 ......... H01L 21/4853
(Continued)

*Primary Examiner* — Laura M Menz
(74) *Attorney, Agent, or Firm* — Slater Matsil, LLP

(57) ABSTRACT

A method includes forming a package component comprising forming a dielectric layer, patterning the dielectric layer to form an opening, and forming a redistribution line including a via in the opening, a conductive pad, and a bent trace. The via is vertically offset from the conductive pad. The conductive pad and the bent trace are over the dielectric layer. The bent trace connects the conductive pad to the via, and the bent trace includes a plurality of sections with lengthwise directions un-parallel to each other. A conductive bump is formed on the conductive pad.

20 Claims, 23 Drawing Sheets

(56) References Cited

U.S. PATENT DOCUMENTS

| | | |
|---|---|---|
| 9,978,655 B2 | 5/2018 | Scanlan et al. |
| 10,763,164 B2 * | 9/2020 | Chen et al. |
| 11,075,151 B2 * | 7/2021 | Tsai ...................... H01L 25/105 |
| 11,217,555 B2 * | 1/2022 | Huang ................ H01L 23/5383 |
| 11,233,022 B2 * | 1/2022 | Ho .................... H01L 23/49822 |
| 11,469,202 B2 | 10/2022 | Son et al. |
| 2005/0260794 A1 | 11/2005 | Lo et al. |
| 2007/0114639 A1 | 5/2007 | Lin et al. |
| 2015/0255422 A1 * | 9/2015 | Paek ........................ H01L 24/81 |
| | | 257/737 |
| 2016/0027747 A1 * | 1/2016 | Ryu ........................ H01L 24/05 |
| | | 257/737 |
| 2019/0103375 A1 * | 4/2019 | Huang .................... H01L 24/16 |
| 2019/0378809 A1 * | 12/2019 | Chen .................. H01L 23/5383 |
| 2020/0328168 A1 | 10/2020 | Roh |
| 2021/0125886 A1 * | 4/2021 | Wang ...................... H01L 24/20 |
| 2021/0183694 A1 * | 6/2021 | Liu ...................... H01L 23/5389 |
| 2021/0296220 A1 * | 9/2021 | Hsu ....................... H01L 25/18 |
| 2022/0020700 A1 * | 1/2022 | Yeh ..................... H01L 25/0657 |
| 2022/0130794 A1 * | 4/2022 | Huang .................... H01L 24/19 |
| 2022/0139860 A1 * | 5/2022 | Lee ........................ H01L 24/11 |
| | | 257/737 |

FOREIGN PATENT DOCUMENTS

| | | | | |
|---|---|---|---|---|
| CN | 114078754 A * | 2/2022 | ............. | H01L 24/02 |
| DE | 102018124695 A1 | 5/2019 | | |
| DE | 102020106782 A1 * | 10/2020 | ......... | H01L 21/4853 |
| DE | 102021104194 A1 * | 5/2022 | ............. | H01L 24/02 |
| KR | 20160113074 A | 9/2016 | | |
| KR | 20170020781 A | 2/2017 | | |
| KR | 20190021127 A | 3/2019 | | |
| KR | 20200120408 A | 10/2020 | | |
| TW | 201830652 A | 8/2018 | | |

* cited by examiner

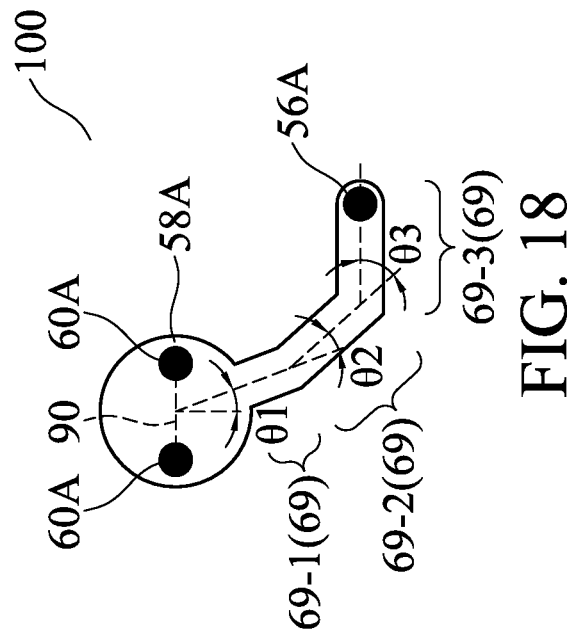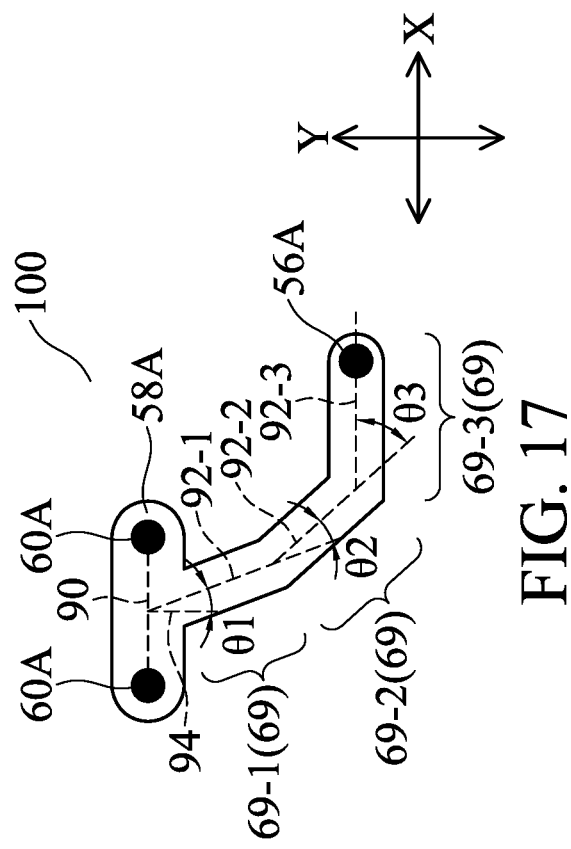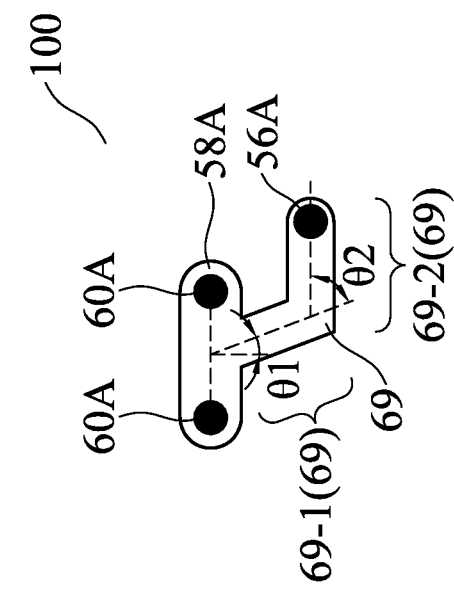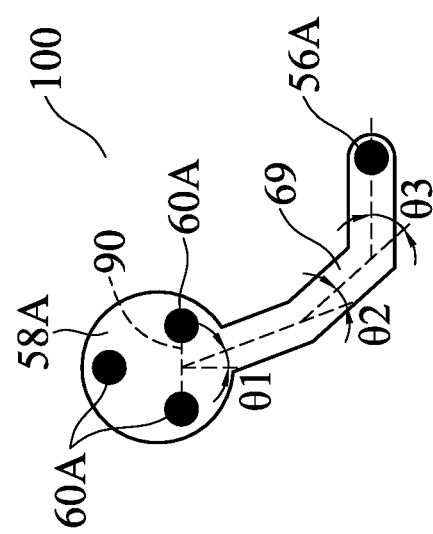

MULTI-BUMP CONNECTION TO INTERCONNECT STRUCTURE AND MANUFACTURING METHOD THEREOF

PRIORITY CLAIM AND CROSS-REFERENCE

This application claims the benefit of the U.S. Provisional Application No. 63/107,055, filed Oct. 29, 2020, and entitled "A Novel Cu Multi-via Structure on Organic Interposer and manufacturing method thereof," which application is hereby incorporated herein by reference.

BACKGROUND

With the evolving of semiconductor technologies, semiconductor chips/dies are becoming increasingly smaller. In the meantime, more functions need to be integrated into the semiconductor dies. Multiple device dies, with each designed for a specific function, may be bonded to together to form a package. The packages are formed larger and larger. On the other hand, the conductive features in the packages such as in the interposers, package substrates, or the like, are becoming increasingly smaller. This demands carefully handling manufacturing processes in order to reduce defects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 17 through 30 illustrate some multi-bump bonding structures in accordance with some embodiments.

DETAILED DESCRIPTION

Figure 1:
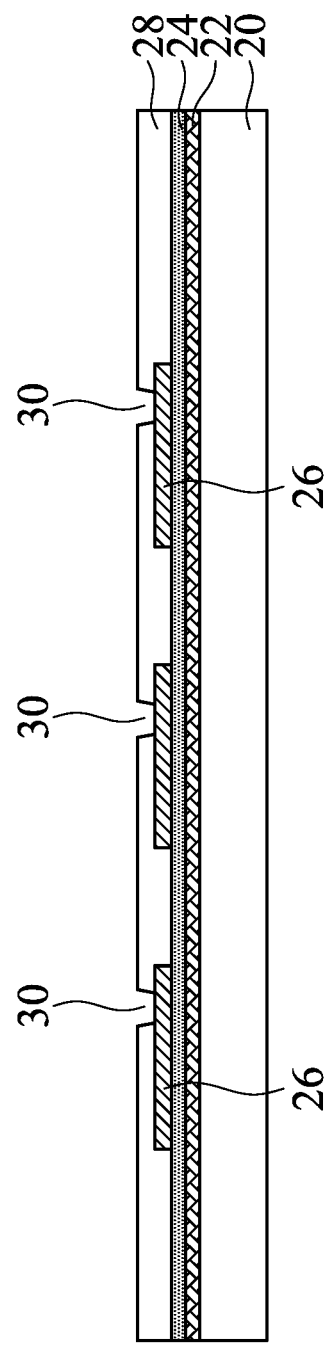
FIGS. 1-10, 11A, 11B, and 12-16 illustrate the cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including multi-bump bonding structures and the method of forming the same are provided. In accordance with some embodiments of the present disclosure, a device die (dies) is bonded to an underlying package component, which may include an interposer, a package substrate, or the like. A plurality of bumps in the device die (dies) are electrically connected to a via in the package component. A bent redistribution line in the package component is between, and interconnects, the plurality of bumps and the via. The plurality of bumps may be bonded to a common metal pad in the package component, and the via is vertically offset from the common metal pad. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 31:
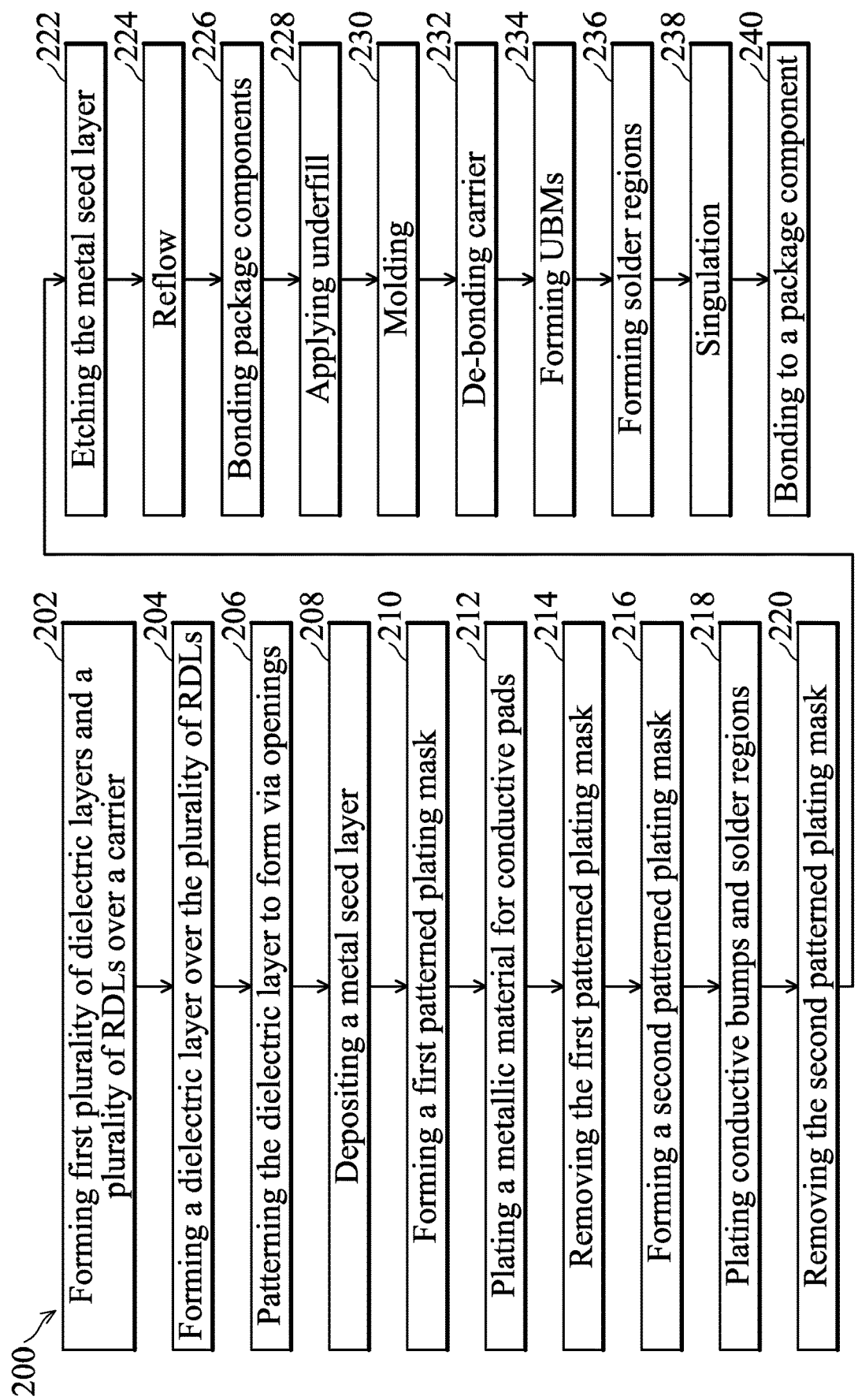
FIG. 31 illustrates a process flow for forming an interconnect component including multi-bump bonding structures in accordance with some embodiments.

FIGS. 1-10, 11A, 11B, and 12-16 illustrate the cross-sectional views of intermediate stages in the formation of an interconnect component including multi-bump bonding structures in accordance with some embodiments of the present disclosure. The corresponding processes are also reflected schematically in the process flow 200 as shown in FIG. 31. It is appreciated that although the interconnect component including the multi-bump bonding structures are formed starting from a carrier, it may also be formed starting from other components such as a fan-out interconnect structure of device dies, a part of a device die or an interposer, etc.

FIGS. 1-10, 11A, 11B, and 12 illustrate the intermediate stages in the formation of a package component 64 (FIG. 12) for redistributing electrical connections. It is appreciated that the illustrated structure and the formation processes are examples, while other structures and formation processes are also in the scope of the present disclosure. For example, in accordance with some embodiments, package component 64 is an organic interposer, which includes organic dielectric layers and redistribution lines formed in the organic dielectric layers. In accordance with other embodiments, package component 64 is a semiconductor interposer, which may include a semiconductor (such as silicon) substrate, through-silicon vias in the semiconductor substrate, and metal lines/vias and/or redistribution lines. In accordance with yet alternative embodiments, package component 64 includes a package substrate, which may be a cored substrate or a coreless substrate. In accordance with some embodiments, as shown in FIGS. 1-10, 11A, 11B, and 12, package component 64 is formed on a carrier. In accordance with alternative embodiments, package component 64 is pre-formed, and is placed on and attached to carrier 20.

FIG. 1 illustrates carrier 20 and release film 22 formed on carrier 20. Carrier 20 may be a glass carrier, a silicon wafer, an organic carrier, or the like. Carrier 20 may have a round top-view shape in accordance with some embodiments. Release film 22 may be formed of a polymer-based material (such as a Light-To-Heat-Conversion (LTHC) material), which is capable of being decomposed under heat-carrying radiation such as a laser beam, so that carrier 20 may be de-bonded from the overlying structures that will be formed in subsequent processes. In accordance with some embodiments of the present disclosure, release film 22 is formed of an epoxy-based thermal-release material, which is coated onto carrier 20.

A plurality of dielectric layers and a plurality of RDLs are formed over the release film 22, as shown in FIGS. 1 through 4. The respective process is illustrated as process 202 in the process flow 200 as shown in FIG. 20. Referring to FIG. 1, dielectric layer 24 is formed on release film 22. In accordance with some embodiments of the present disclosure, dielectric layer 24 is formed of a polymer, which may also be a photo-sensitive material such as polybenzoxazole (PBO), polyimide, benzocyclobutene (BCB), or the like, that may be patterned using a photo lithography process including a light-exposure process and a development process.

Redistribution Lines (RDLs) 26 are formed over dielectric layer 24 in accordance with some embodiments. The formation of RDLs 26 may include forming a seed layer (not shown) over dielectric layer 24, forming a patterned mask (not shown) such as a photo resist over the seed layer, and then performing a metal plating process on the exposed seed layer. The patterned mask and the portions of the seed layer covered by the patterned mask are then removed, leaving RDLs 26 as in FIG. 1. In accordance with some embodiments of the present disclosure, the seed layer includes a titanium layer and a copper layer over the titanium layer. The seed layer may be formed using, for example, Physical Vapor Deposition (PVD) or a like process. The plating may be performed using, for example, electro-less plating.

Further referring to FIG. 1, dielectric layer 28 is formed on RDLs 26. The bottom surface of dielectric layer 28 is in contact with the top surfaces of RDLs 26 and dielectric layer 24. In accordance with some embodiments of the present disclosure, dielectric layer 28 is formed of a polymer, which may be a photo-sensitive material such as PBO, polyimide, BCB, or the like. Alternatively, dielectric layer 28 may include a non-organic dielectric material such as silicon oxide, silicon nitride, silicon carbide, silicon oxynitride, or the like. Dielectric layer 28 is then patterned to form openings 30 therein. Hence, some portions of RDLs 26 are exposed through the openings 30 in dielectric layer 28.

Figure 2:
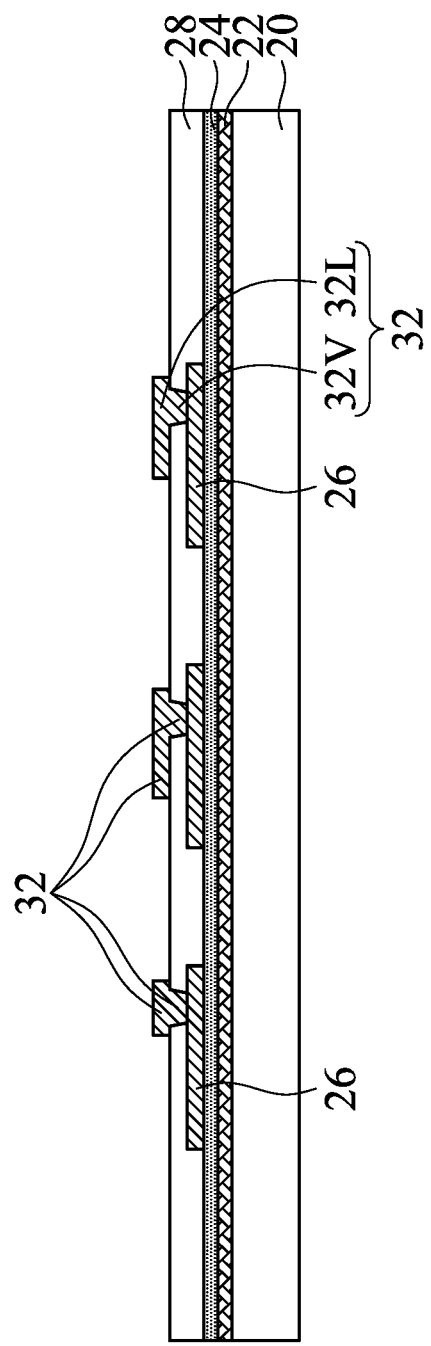

Next, referring to FIG. 2, RDLs 32 are formed to connect to RDLs 26. RDLs 32 include metal traces (metal lines) over dielectric layer 28. RDLs 32 also include vias extending into the openings 30 in dielectric layer 28. RDLs 32 may also be formed through a plating process, wherein each of RDLs 32 includes a seed layer (not shown) and a plated metallic material over the seed layer. In accordance with some embodiments, the formation of RDLs 32 may include depositing a blanket metal seed layer extending into the via openings, and forming and patterning a plating mask (such as photo resist), with openings formed over and joining to the via openings. A plating process is then performed to plate a metallic material, which fully fills the via openings 30, and has some portions higher than the top surface of dielectric layer 28. The plating mask is then removed, followed by an etching process to remove the exposed portions of the metal seed layer, which was previously covered by the plating mask. The remaining portions of the metal seed layer and the plated metallic material are RDLs 32.

The metal seed layer and the plated material may be formed of the same material or different materials. The metallic material in RDLs 32 may include a metal or a metal alloy including copper, aluminum, tungsten, or alloys thereof. RDLs 32 include RDL lines (also referred to as traces or trace portions) 32L and via portions (also referred to as vias) 32V, wherein trace portions 32L are over dielectric layer 28, and via portions 32V are in dielectric layer 28. Since trace portions 32L and via portions (also referred to as vias) 32V are formed in a same plating process, there is no distinguishable interface between vias 32V and the corresponding overlying trace portions 32L. Also, each of vias 32V may have a tapered profile, with the upper portions wider than the corresponding lower portions.

Figure 3:
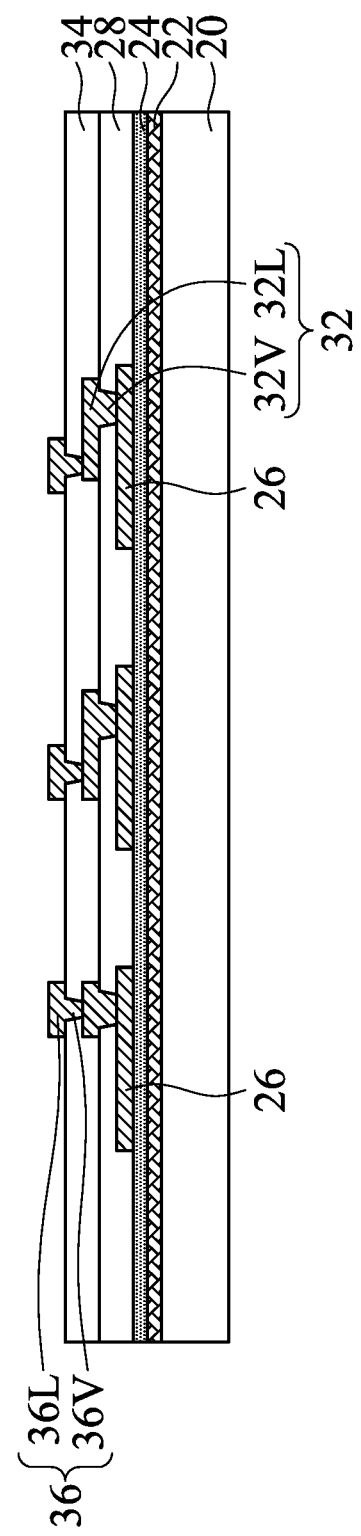

Referring to FIG. 3, dielectric layer 34 is formed over RDLs 32 and dielectric layer 28. Dielectric layer 34 may be formed using a polymer, which may be selected from the same group of candidate materials as those for forming dielectric layer 28. For example, dielectric layer 34 may be formed of PBO, polyimide, BCB, or the like. Alternatively, dielectric layer 34 may include a non-organic dielectric material such as silicon oxide, silicon nitride, silicon carbide, silicon oxynitride, or the like.

FIG. 3 further illustrates the formation of RDLs 36, which are electrically connected to RDLs 32. The formation of RDLs 36 may adopt the methods and materials similar to those for forming RDLs 32. RDLs 36 include the trace portions (RDL lines) 36L and via portions (vias) 36V, wherein trace portions 36L are over dielectric layer 34, and via portions 36V extend into dielectric layer 34. Also, each of vias 36V may have a tapered profile, with the upper portions wider than the corresponding lower portions.

Figure 4:
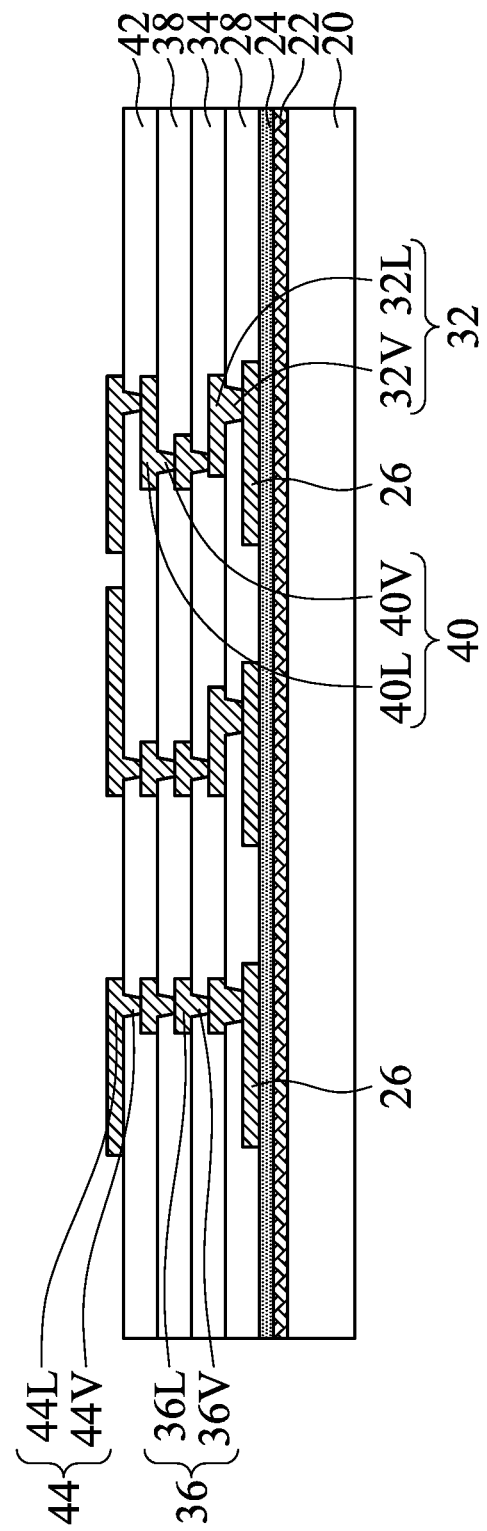

FIG. 4 illustrates the formation of dielectric layers 38 and 42 and RDLs 40 and 44. RDLs 40 include the trace portions (RDL lines) 40L and via portions (vias) 40V, wherein trace portions 40L are over dielectric layer 38, and via portions 40V extend into dielectric layer 38. RDLs 44 include the trace portions (RDL lines) 44L and via portions (vias) 44V, wherein trace portions 44L are over dielectric layer 42, and via portions 44V extend into dielectric layer 42. In accordance with some embodiments of the present disclosure, dielectric layers 38 and 42 are formed of materials selected from the same group of candidate materials for forming dielectric layers 34 and 28, and may include organic materials or inorganic materials, as aforementioned. It is appreciated that although in the illustrated example embodiments, four dielectric layers 28, 34, 38, and 42, and the respective RDLs 32, 36, 40, and 44 formed therein are discussed as an example, fewer or more dielectric layers and RDL layers may be adopted, depending on the routing requirement.

Figure 5:
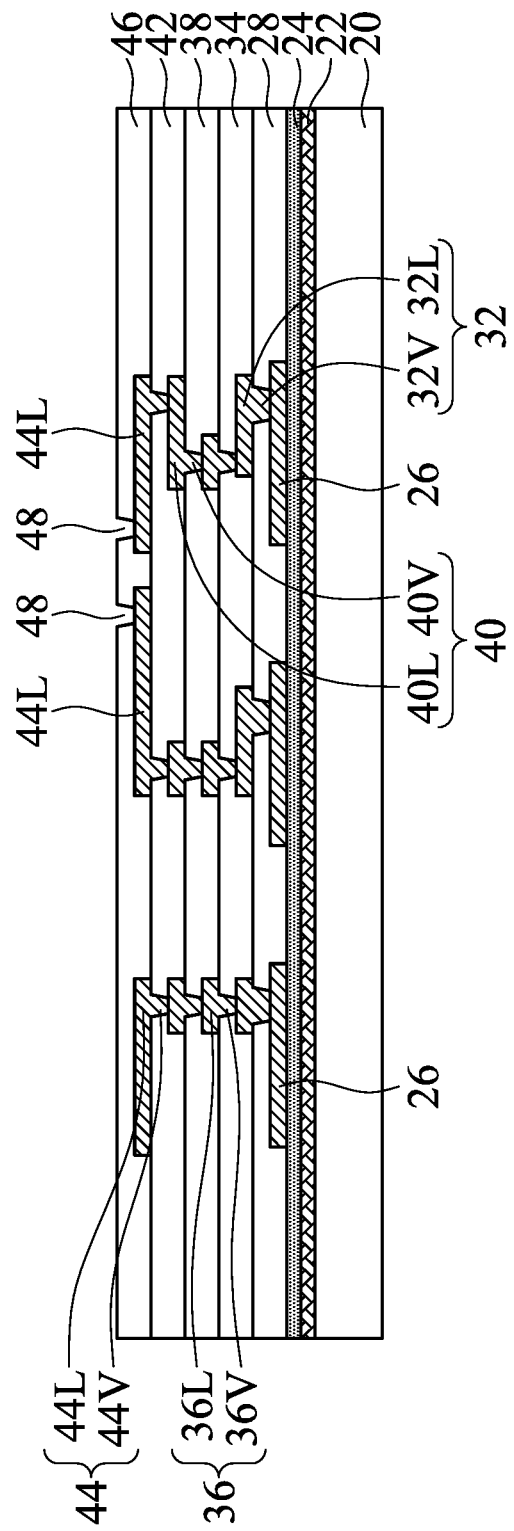

FIGS. 5 through 10 illustrate the formation of vias 56 (FIG. 10), conductive pads 58, and conductive bumps 60 (also referred to as Under-Bump metallurgies (UBMs)) in accordance with some embodiments. Referring to FIG. 5, dielectric layer 46 is formed. The respective process is illustrated as process 204 in the process flow 200 as shown in FIG. 31. In accordance with some embodiments, dielectric layer 46 is formed of a polymer, which may be a photo-sensitive material such as PBO, polyimide, BCB, or the like. Dielectric layer 46 is patterned to form via openings 48, so that the underlying pad portions of RDL lines 44L are exposed. The respective process is illustrated as process 206 in the process flow 200 as shown in FIG. 31.

Figure 6:
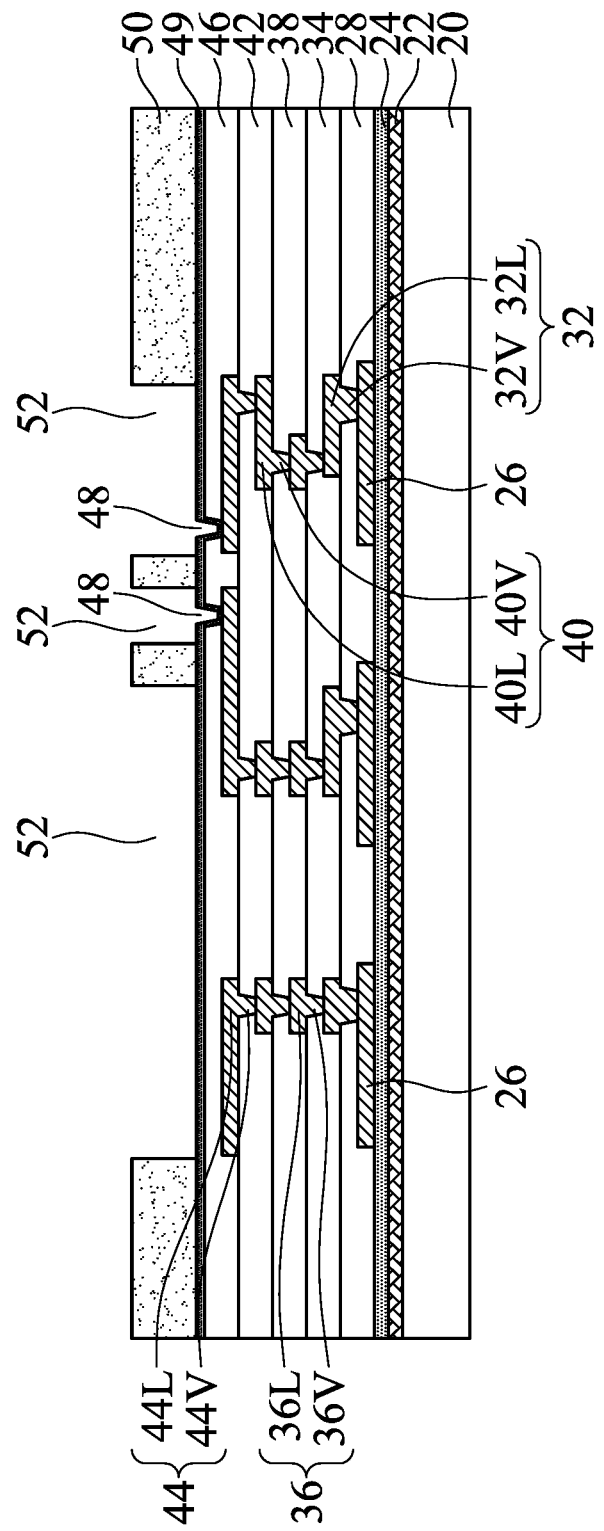

Referring to FIG. 6, metal seed layer 49 is deposited. The respective process is illustrated as process 208 in the process flow 200 as shown in FIG. 31. In accordance with some embodiments, metal seed layer 49 includes a titanium layer and a copper layer over the titanium layer. In accordance with alternative embodiments, metal seed layer 49 includes a single copper layer, which is in physical contact with dielectric layer 46. Plating mask 50 is then formed and patterned, with openings 52 being formed in plating mask 50. The respective process is illustrated as process 210 in the process flow 200 as shown in FIG. 31. Via openings 48 are under and joined with openings 52. The top-view shape of openings 52 may include circles or polygonal shapes such as hexagonal shapes, octagonal shapes, bent strips, and/or the like.

Figure 7:
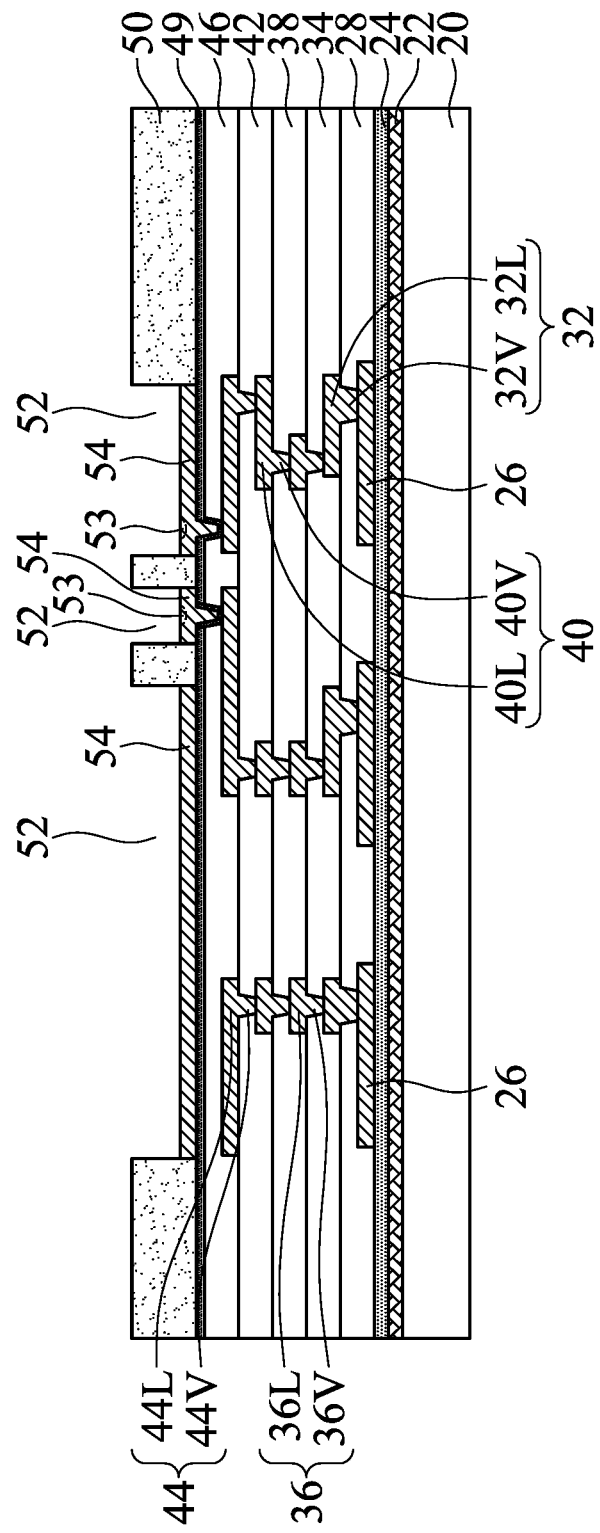

Referring to FIG. 7, metallic material 54 is deposited through a plating process. The respective process is illustrated as process 212 in the process flow 200 as shown in FIG. 31. The plating process may include an electrochemical plating process, an electroless plating process, or the like. In accordance with some embodiments, metallic material 54 comprises copper or a copper alloy. Process conditions may be adjusted, so that the top surface of the plated material 54 may be planar. In accordance with alternative embodiments, the portions of the top surfaces of metallic material 54 may have recesses, as illustrated by dashed lines 53, which recesses are formed due to the filling of via openings 48 (FIG. 6).

In subsequent processes, plating mask 50, which may be a photo resist, is removed, for example, through an ashing process or an etching process. The respective process is illustrated as process 214 in the process flow 200 as shown in FIG. 31. The underlying portions of metal seed layer 49 are thus exposed.

Figure 8:
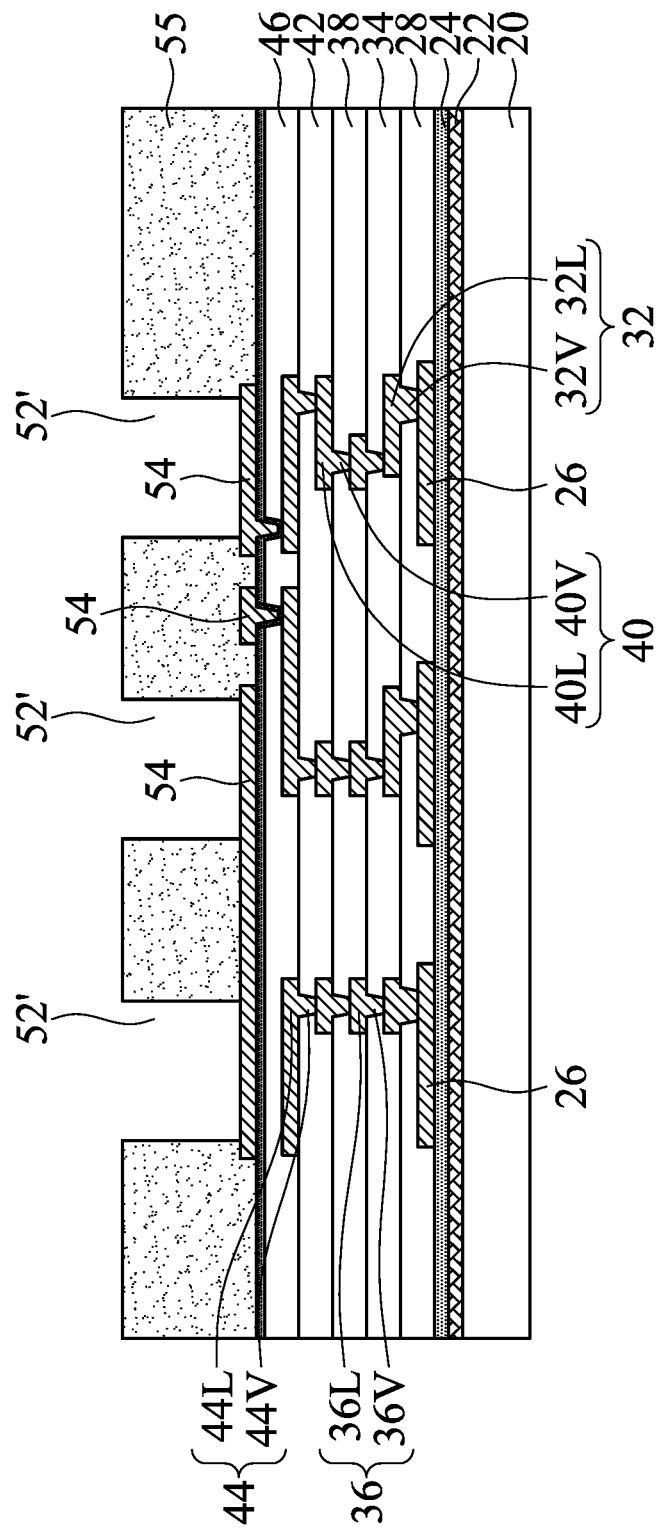

Referring to FIG. 8, without removing metal seed layer 49, plating mask 55 is formed on metal seed layer 49 and plated material 54, with openings 52' being formed to reveal the plated material 54. The respective process is illustrated as process 216 in the process flow 200 as shown in FIG. 31.

Figure 9:
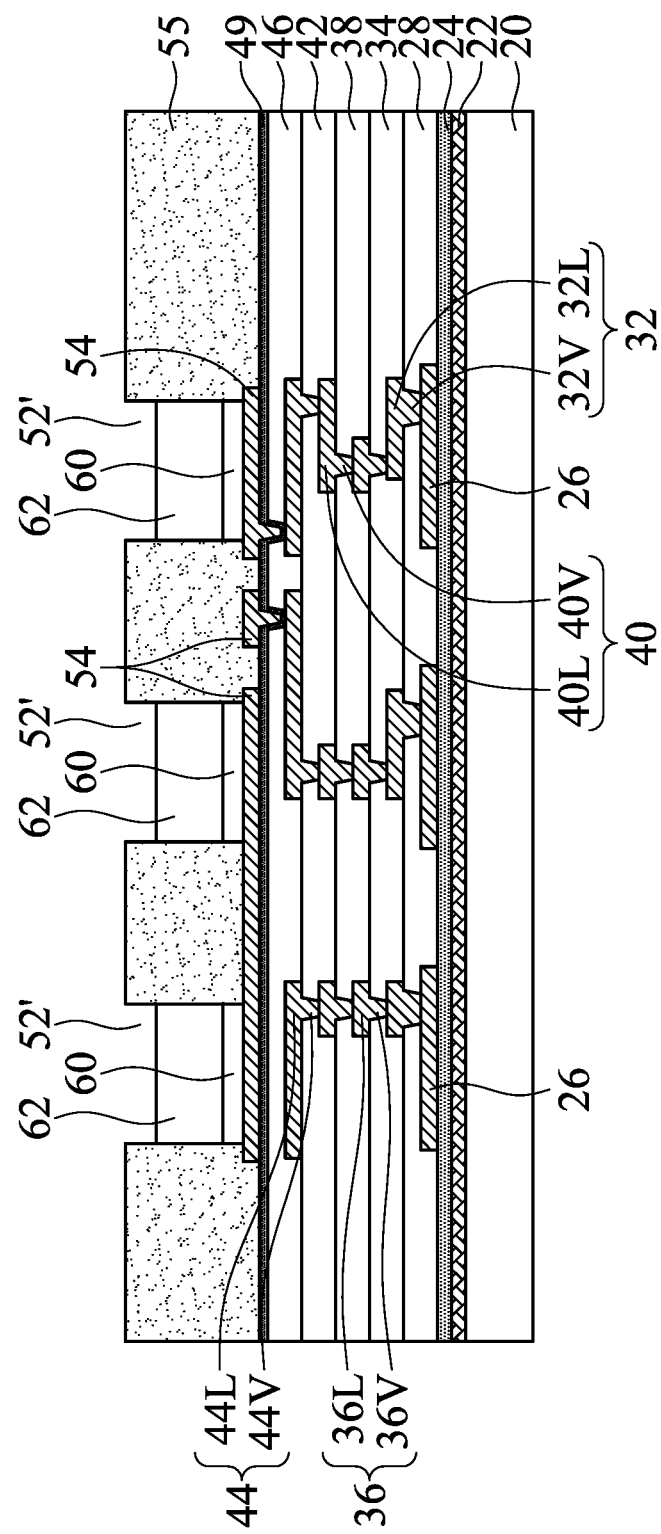

Next, as shown in FIG. 9, conductive bumps 60 are formed through a plating process, which may be an electrochemical plating process or an electroless plating process, for example. The respective process is illustrated as process 218 in the process flow 200 as shown in FIG. 31. The entireties of conductive bumps 60 may be formed of a homogeneous material such as copper or a copper alloy, and the material may be the same as or different from conductive material 54. Conductive bumps 60 and the underlying plated material 54 may have distinguishable interfaces in between, or may be merged with each other (for example, when both formed of copper) without distinguishable interface in between. Conductive bumps 60 are also referred to as metal pillars or metal rods due to their shapes. Conductive bumps 60 may have round top-view shapes, while other shapes such as hexagonal shapes, octagonal shapes, or the like may also be adopted, depending on the top-view shapes of openings 52'. FIG. 9 further illustrates the deposition of solder regions 62 in accordance with some embodiments, which are also deposited through plating. Solder regions 62 may be formed of or comprise AgSn, AgSnCu, SnPb, or the like. In accordance with alternative embodiments, solder regions 62 are not formed.

Figure 10:
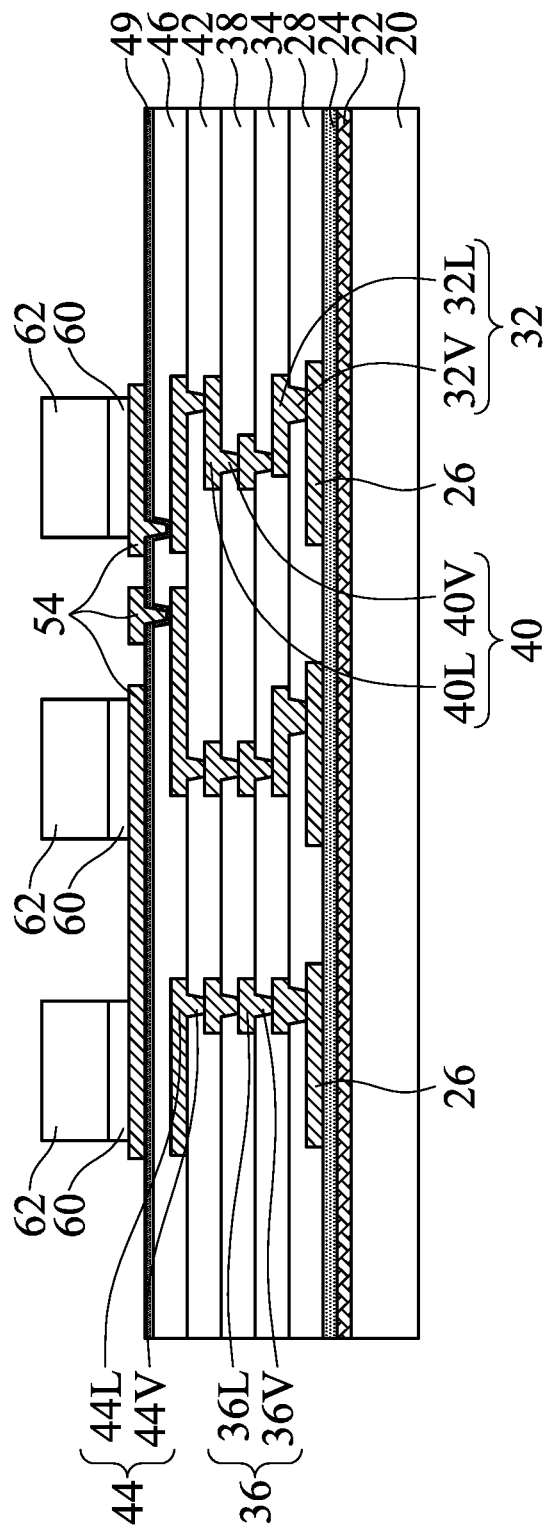

In a subsequent process, plating mask 55 is removed, for example, through an ashing process or an etching process. The respective process is illustrated as process 220 in the process flow 200 as shown in FIG. 31. The resulting structure is shown in FIG. 10.

Figure 11A:
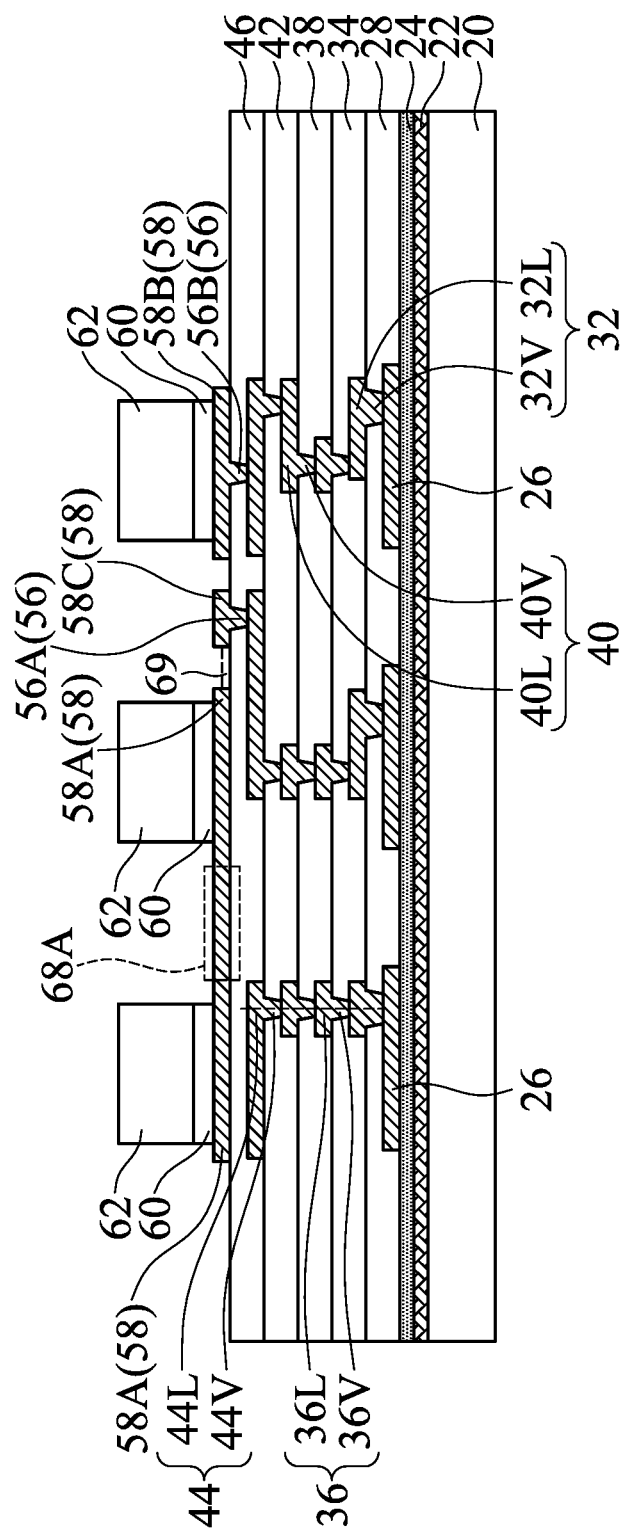

Next, an etching process, which may include a wet etching process and/or a dry etching process, is performed to remove the exposed portions of metal seed layer 49. The respective process is illustrated as process 222 in the process flow 200 as shown in FIG. 31. The portions of metal seed layer 49 directly under the plated metallic material 54 are left. Throughout the description, metallic material 54 and the underlying remaining portions of metal seed layer 49 are collectively referred to as vias 56 (including vias 56A and 56B) and conductive pads 58 (including 58A, 58B, and 58C). Conductive pads 58 and vias 56 also in combination form redistribution lines. The resulting structure is shown in FIG. 11A. Vias 56 are the portions of the redistribution lines in dielectric layer 46, while conductive pads 58 are the portions of the redistribution lines over dielectric layer 46. Each of vias 56 and conductive pads 58 may include a remaining portion of the metal seed layer 49, and a portion of the plated material 54.

As shown in FIG. 11A, some of conductive pads 58 (such as 58A) may not have any vias directly underlying and joining to them. On the other hand, some of conductive pads 58 (such as conductive pad 58B may have vias directly under them. Via 56A is electrically connected to conductive pad 58A through conductive trace 69, which may be bent, and is schematically illustrated using a dashed line since it is not in the illustrated plane. Conductive trace 69 may be found referring to FIGS. 17 through 30.

Referring to FIG. 11A again, in accordance with some embodiments of the present disclosure, there is a continuous conductive pad 58A underlying and physically joining two (or more) conductive bumps 60. In accordance with alternative embodiments, the portion of conductive pad 58A in region 68A is not formed, and accordingly, conductive pads 58A are discrete conductive pads, each having a corresponding conductive bump 60 overlying and physically contacting it. It is appreciated that the bonding structure with a continuous conductive pad 58A underlying two or more conductive bumps 60 may exist in the same package as the bonding structures with a single discrete conductive pad 58 underlying each of conductive bumps 60. Also, both of the bonding structures may be connected to the same device die.

Figure 11B:
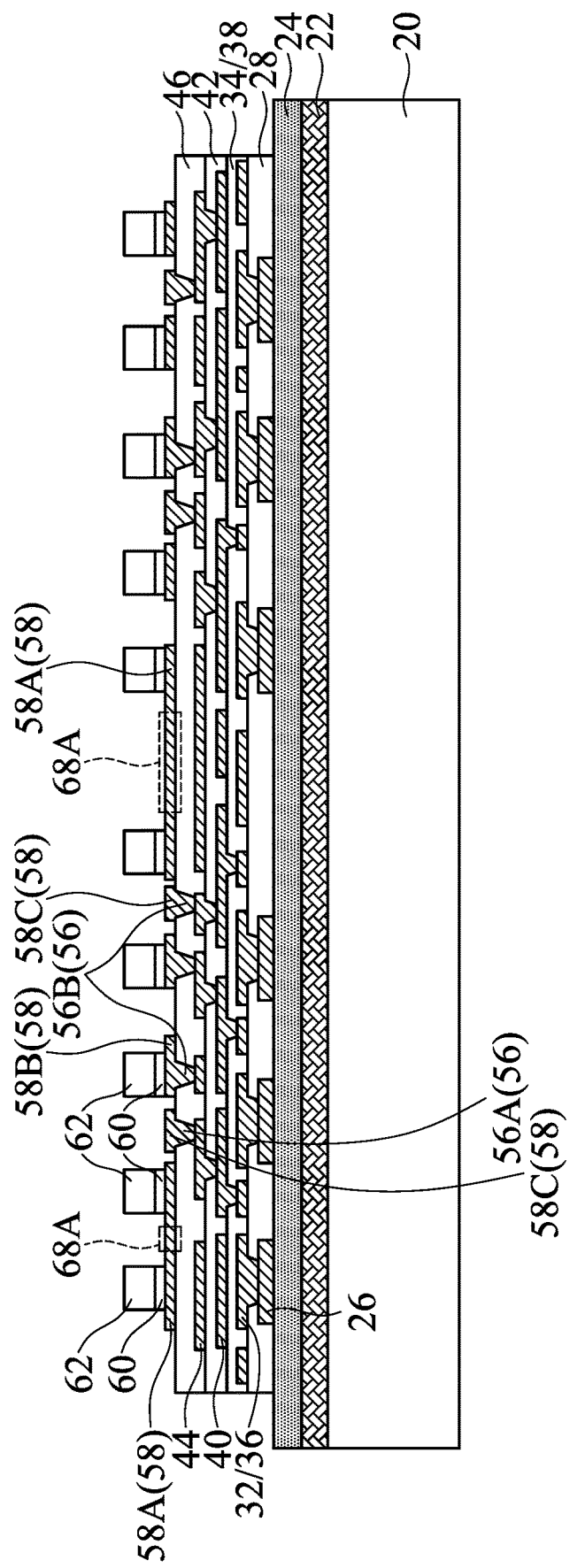

FIG. 11B illustrates the same structure shown in FIG. 11A, except FIG. 11A illustrates a portion of the structure shown in FIG. 11B. Some of dielectric layers such as dielectric layers 34 and 38 in FIG. 11A are illustrated together as dielectric layers 34/38, and the corresponding RDLs 32 and 36 are also illustrated together as RDLs 32/36.

Figure 12:
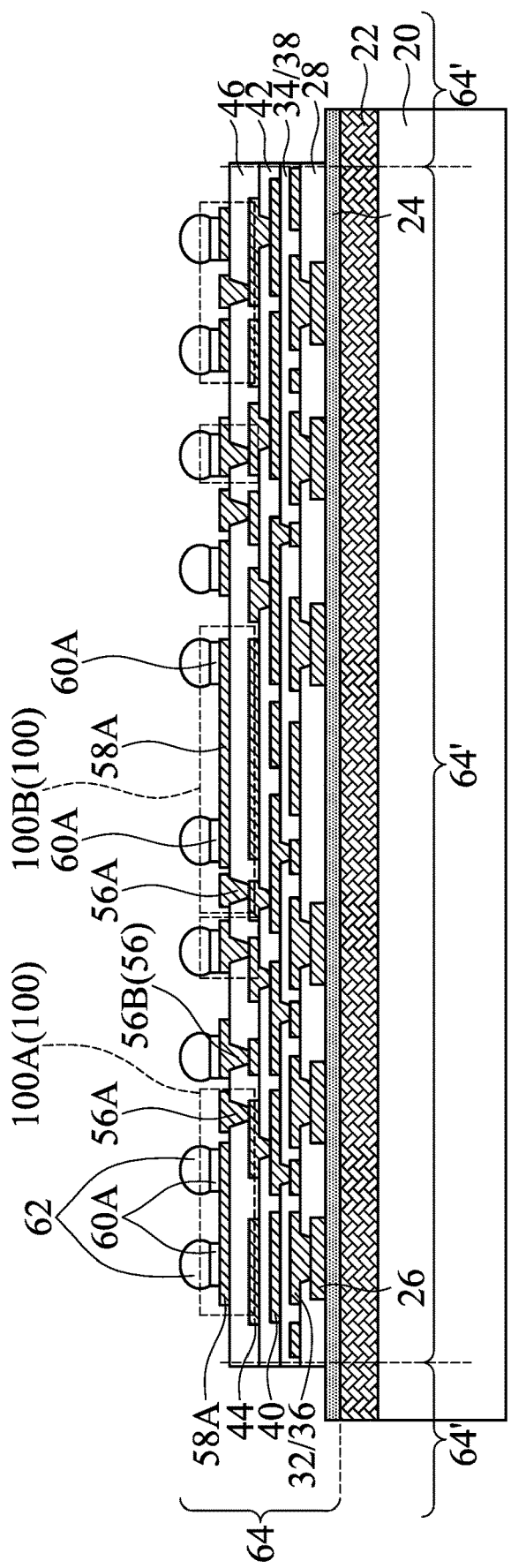

Referring to FIG. 12, a reflow process is performed to reflow solder regions 62. The respective process is illustrated as process 224 in the process flow 200 as shown in FIG. 31. Throughout the description, the structure over release film 22 are referred to as interconnect component 64, which is also referred to as package component 64. Interconnect component 64 may include a plurality of identical interconnect components 64', which may be sawed apart in subsequent processes.

Figure 13:
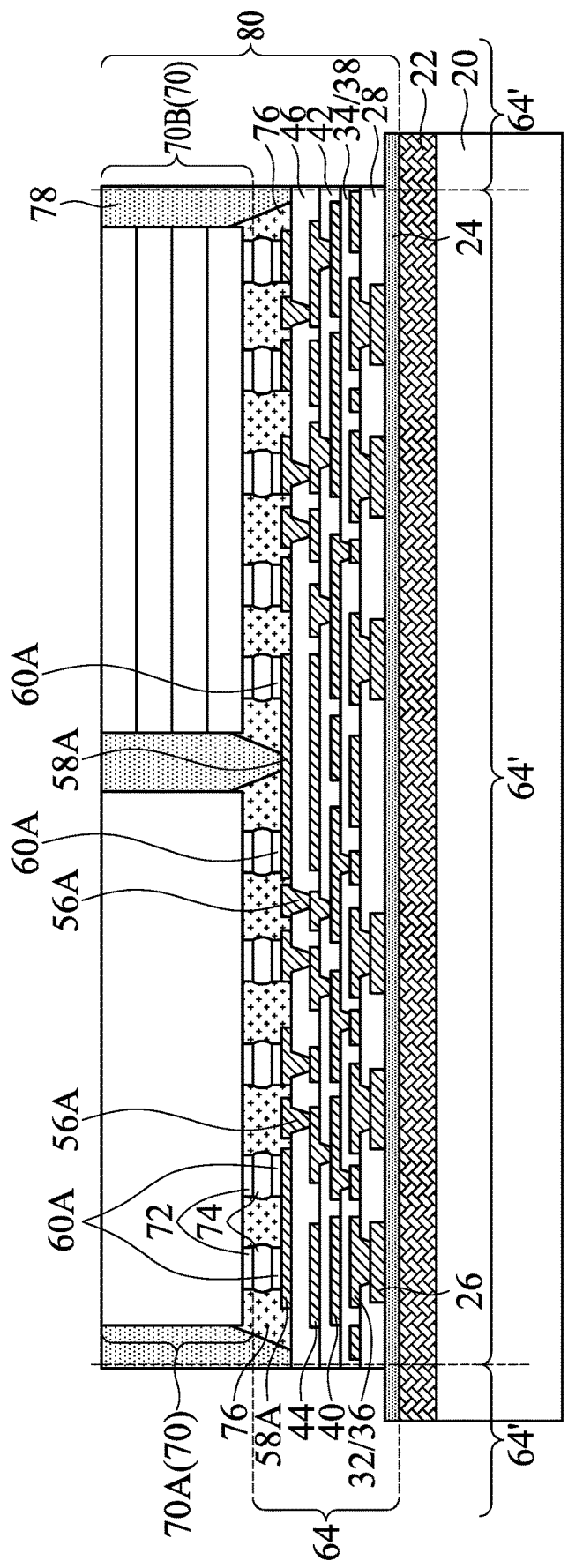

FIG. 13 illustrates the bonding of package components 70 to interconnect component 64. The respective process is illustrated as process 226 in the process flow 200 as shown in FIG. 31. Each interconnect component 64' is bonded to one or a plurality of package components 70 (including 70A and 70B as an example). In accordance with some embodiments, package components 70 include a logic die, which may be a Central Processing Unit (CPU) die, a Graphic Processing Unit (GPU) die, a mobile application die, a Micro Control Unit (MCU) die, an input-output (IO) die, a BaseBand (BB) die, an Application processor (AP) die, or the like. Package components 70 may also include memory dies such as Dynamic Random Access Memory (DRAM) dies, Static Random Access Memory (SRAM) dies, or the like. The memory dies may be discrete memory dies, or may be in the form of a die stack that includes a plurality of stacked memory dies. Package components 70 may also include System-on-Chip (SOC) dies. In accordance with some embodiments, package components 70 include package component 70A, which may be a logic die or an SOC die. In accordance with some embodiments, package component 70A includes a semiconductor substrate and integrated circuit devices (not shown, including transistors, for example) formed on the semiconductor substrate. Package components 70 may further include package component 70B, which may be a memory die or a memory stack.

Interconnect components 64' may be used for forming packages. In accordance with some embodiments, electrical connectors 72, which are on the surfaces of package components 70, are bonded to interconnect components 64' through soldered regions 74. Solder regions 74 may include the solder regions 62 as shown in FIG. 12. Electrical connectors 72 may be or may comprise UBMs, metal pillars, bond pads, or the like. In accordance with alternative embodiments, electrical connectors 72 are metal pillars, and are bonded to conductive bumps 60 through direct metal-to-metal bonding. In accordance with these embodiments, the solder regions 62 (FIG. 12) are not formed, and conductive bumps 60 are physically joined to electrical connectors 72. In accordance with yet alternative embodiments, package components 70 are bonded to interconnect components 64' through hybrid bonding (including both of metal-to-metal bonding and dielectric-to-dielectric bonding), or the like.

After the bonding process, underfill 76 is dispensed into the gap between package components 70 and interconnect component 64'. The respective process is illustrated as process 228 in the process flow 200 as shown in FIG. 31. Underfill 76 is in contact with the top surfaces and the sidewalls of the extension portions of conductive pads 58, with the extension portions being extending laterally beyond the edges of the overlying conductive bumps 60. The extension portions include the traces 69 as shown in FIGS. 17 through 30. Encapsulant 78, which may be formed of or comprise a molding compound, is dispensed and cured. The respective process is illustrated as process 230 in the process flow 200 as shown in FIG. 31. A planarization process may be performed to level the top surfaces of package components 70 with the top surface of encapsulant 78. Throughout the description, the structure including dielectric layer 24 and the overlying features are collectively referred to as reconstructed wafer 80.

Reconstructed wafer 80 is then de-bonded from carrier 20, for example, by projecting UV light or a laser beam on release film 22, so that release film 22 decomposes under the heat of the UV light or the laser beam. The respective process is illustrated as process 232 in the process flow 200 as shown in FIG. 31. Reconstructed wafer 80 is thus separated from carrier 20. In the resulting reconstructed wafer 80, dielectric layer 24 may be exposed.

Figure 14:
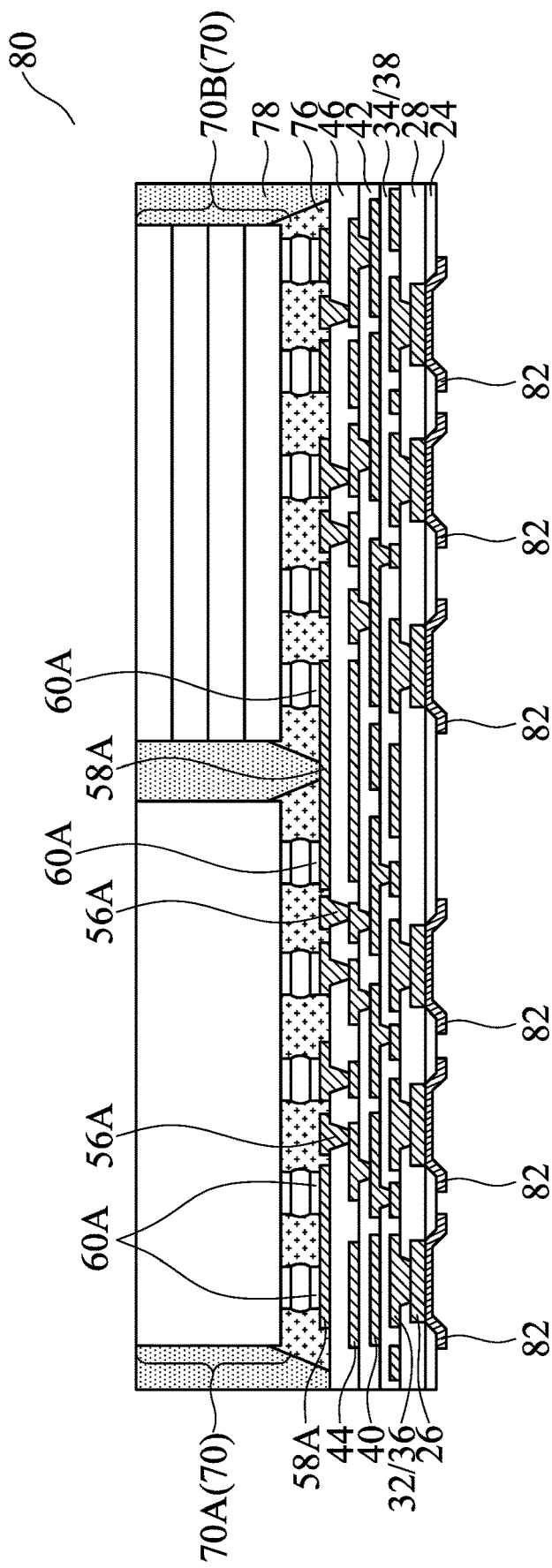
Figure 15:
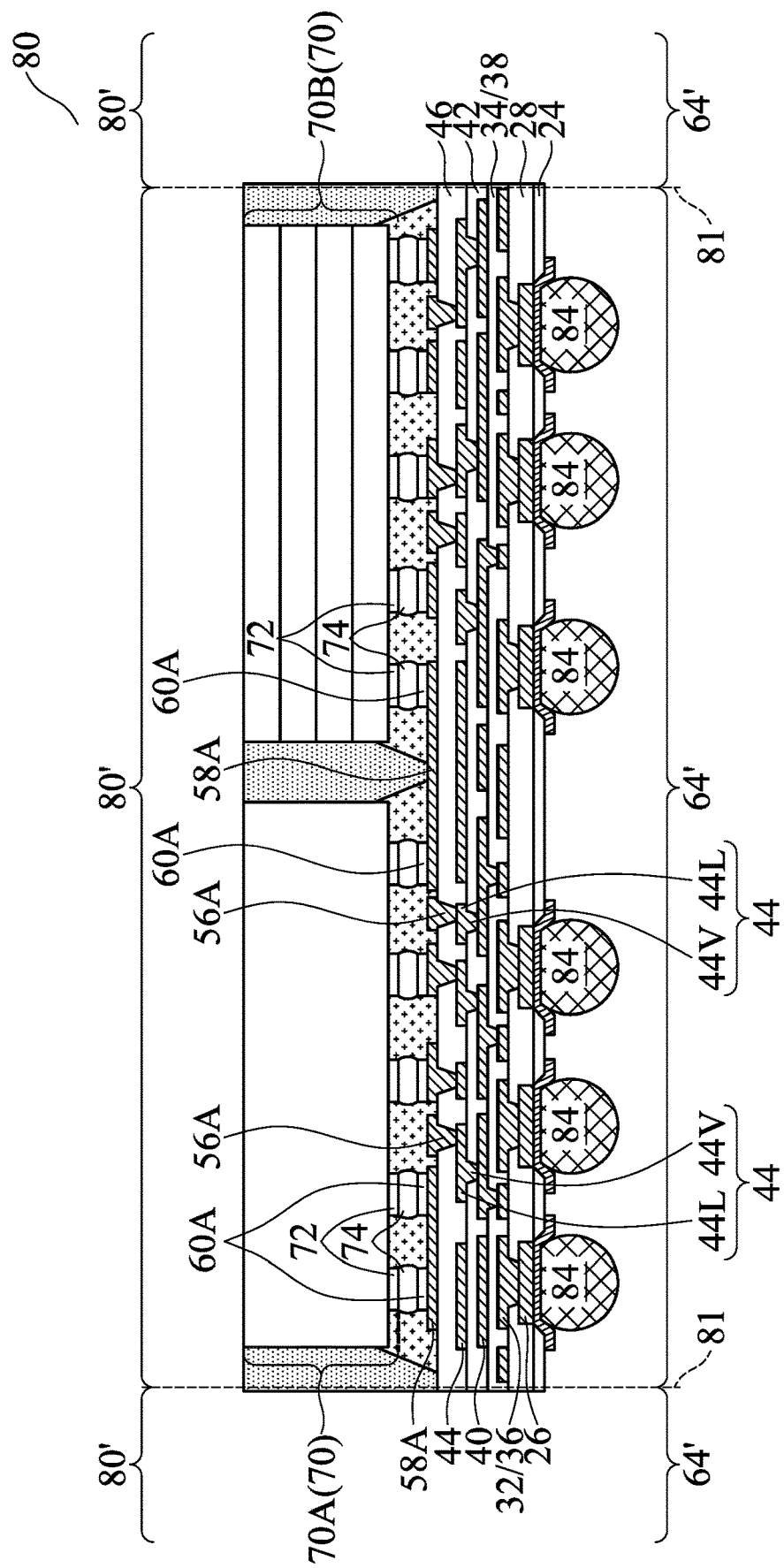

Referring to FIG. 14, electrical connectors 82 are formed to electrically connect to RDLs 26. The respective process is illustrated as process 234 in the process flow 200 as shown in FIG. 31. In accordance with some embodiments, electrical connectors 82 are UBMs. The formation process of UBMs 82 may also include patterning dielectric layer 24 to form openings, depositing a metal seed layer, which may include a titanium layer and a copper layer on the titanium layer, forming and patterning a plating mask, plating a conductive material, removing the plating mask, and etching the metal seed layer. In accordance with some embodiments, solder regions 84 are formed on UBMs 82, and the formation process may include placing solder balls into the openings, and performing a reflow process to reflow the solder regions. The respective process is illustrated as process 236 in the process flow 200 as shown in FIG. 31.

In a subsequent process, reconstructed wafer 80 may be placed on a frame (not shown), with solder regions 84 or UBMs 82 adhered to a tape attached to the frame. In a subsequent process, a singulation process is performed, and reconstructed wafer 80 is sawed apart in a singulation process to form a plurality of identical packages 80', each including one of interconnect components 64' (also referred to as package components 64'), and one or more package components 70. The respective process is illustrated as process 238 in the process flow 200 as shown in FIG. 31. The singulation process may be performed by sawing reconstructed wafer 80 along scribe lines 81.

Figure 16:
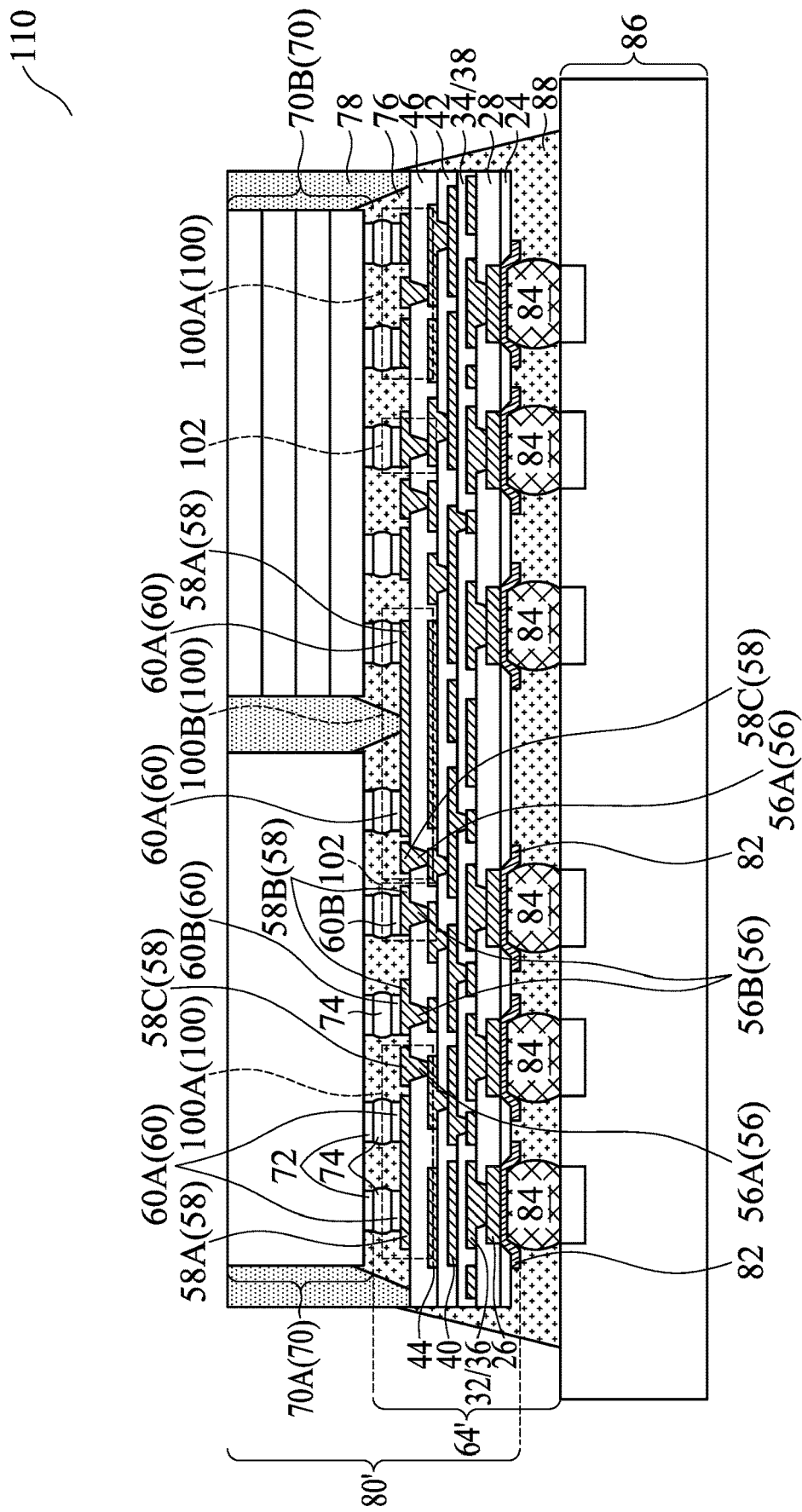
Figure 22:
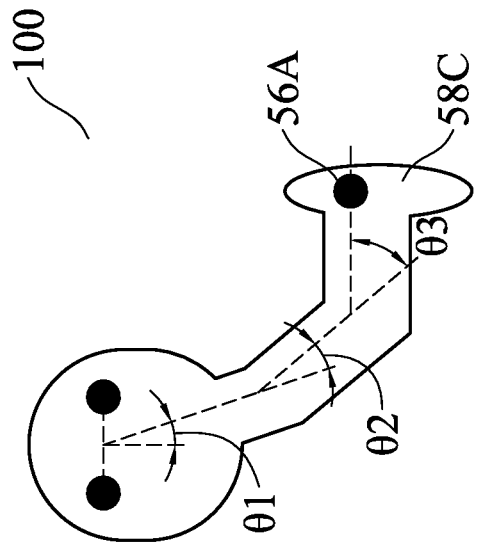
Figure 24:
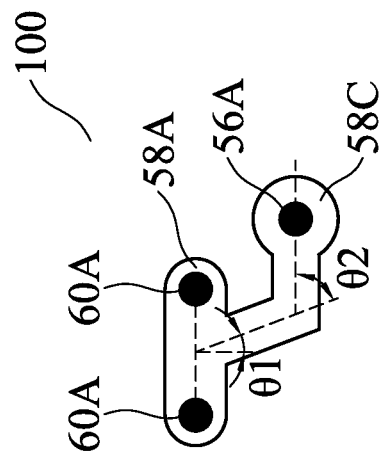
Figure 21:
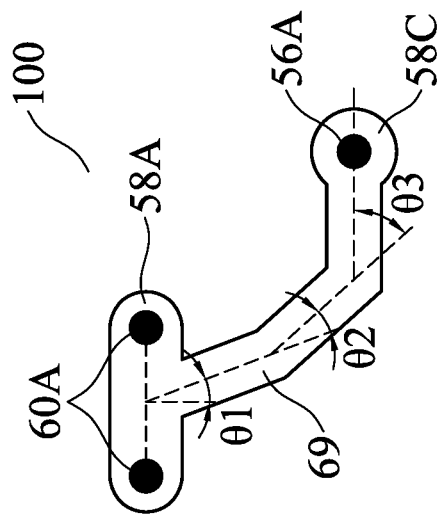
Figure 23:
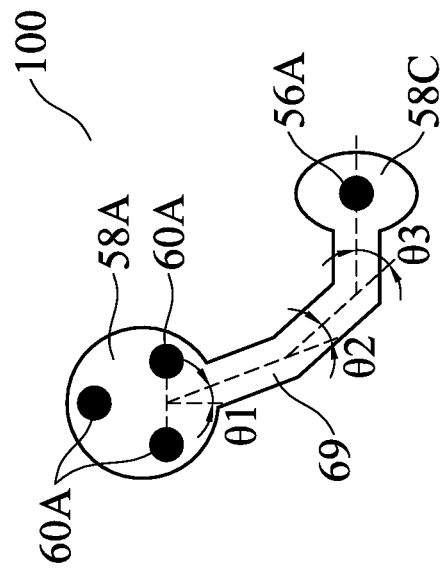

FIG. 16 illustrates the bonding of package 80' to package component 86 to form package 110. The respective process is illustrated as process 240 in the process flow 200 as shown in FIG. 31. In accordance with some embodiments, package component 86 is or comprises an interposer, a package substrate, a printed circuit board, or the like. The bonding may be achieved through solder regions 84. Underfill 88 is dispensed between interconnect component 64' and package component 86.

FIGS. 17 through 30 illustrate the top views of multi-bump bonding structure 100, each maybe the multi-bump bonding structure 100A or the multi-bump bonding structure 100B in FIG. 16. FIG. 17 illustrates a top view of a multi-bump bonding structure 100, which includes two conductive bumps 60A, conductive pad 58A underlying and contacting conductive bumps 60A, bent conductive trace 69, and via 56A underlying and physically contacting conductive trace 69 (also referred to as RDL 69). Bent conductive trace 69 is formed by the same plating process for forming vias 56 and conductive pad 58A. In FIGS. 17 through 30, bent conductive traces 69 may have a uniform width or a substantially uniform width, for example, with the widths of different parts of a bent trace being having a variation smaller than about 20 percent.

In accordance with some embodiments, bent conductive trace 69 includes three sections 69-1, 69-2, and 69-3, whose lengthwise directions are not aligned to a same straight line. A straight line 90 may be drawn to interconnect conductive bumps 60A. Sections 69-1, 69-2, and 69-3 have middle (lengthwise) lines 92-1, 92-2, and 92-3, respectively, which extend in the lengthwise directions of the respective sections. Section 69-1 may be connected to the middle of conductive pad 58A to reduce stress, although it can also be connected to any other part of conductive pad 58A. If a straight line 94 is drawn from the connecting point and in the direction perpendicular to line 90, the angle 61 between lines 90-1 and 94 is referred to as the tilt angle of section 69-1. In accordance with some embodiments, tilt angle 61 is in the range between (and including 0 degrees) and about 90 degrees. Tilt angle 61 may also be in the range between (and including 0 degrees) and about 45 degrees. Tilt angle 62 is formed between line 90-1 of section 69-1 and 90-2 of section 69-2. Tilt angle 63 is formed between line 90-2 of section 69-2 and 90-3 of section 69-3. Tilt angles 62 and 63 may also be in the range between (and including 0 degrees) and about 90 degrees, or the range between (and including 0 degrees) and about 45 degrees. Forming bent conductive trace 69 as being a bent line may advantageously redistribute stress in bent conductive trace 69, so that the stress that originally exists in only one direction is redistributed into X and Y directions to prevent the possible damage of the RDL in some embodiments. Furthermore, by forming via 56A vertically offset from (which means it is not directly underlying) conductive pad 58A, the force applied by conductive bumps 60A and conductive pad 58A is not applied to the underlying RDL 44L directly, and the damage to RDL 44L is further reduced.

FIG. 18 illustrates a multi-bump bonding structure 100 in accordance with alternative embodiments. These embodiments are similar to the embodiments as shown in FIG. 17, except that the conductive pad 58A in FIG. 17 is elongated, while the conductive pad 58A in FIG. 18 has a circular shape. It is appreciated that conductive pad 58A may have any applicable shape including, and not limited to, rectangular shape, hexagonal shape, octagonal shape, oval shape, or the like.

FIG. 19 illustrates a multi-bump bonding structure 100 in accordance with alternative embodiments. These embodiments are similar to the embodiments as shown in FIG. 18, except that in FIG. 18, there are two conductive bumps 60A over and contacting the same conductive pad 58A, while in FIG. 19, there are three (or more than three) conductive bumps 60A over and contacting the same conductive pad 58A.

FIG. 20 illustrates a multi-bump bonding structure 100 in accordance with alternative embodiments. These embodiments are similar to the embodiments as shown in FIG. 17, except that in FIG. 17, bent conductive trace 69 has three sections, while in FIG. 20, bent conductive trace 69 has two sections.

In accordance with some embodiments, bent conductive trace 69 may have an arc shape overall, and the arc shape is achieved through a plurality of sections. The number of sections may be any number equal to or greater than 2, with a greater number having better effect in redistributing stress, while the effect of redistributing stress gradually saturate when the total number sections is equal to or greater than 3. In accordance with alternative embodiments, bent conductive trace 69 may have the overall shape close to what are shown in FIGS. 17 through 20, except that bent conductive trace 69 is continuously curved without straight portions.

FIGS. 21 through 24 illustrate some multi-bump bonding structures 100 in accordance with alternative embodiments. These embodiments are similar to the embodiments as shown in FIG. 17 through 20, respectively, except that in FIGS. 17 through 20, vias 56A are directly under the bent conductive trace 69, with no conductive pad formed directly over vias 56A, while in FIGS. 21 through 24, conductive pads 58C are formed directly over vias 56A. The conductive pads 58C may have various applicable shapes including, and not limited to, circles (FIGS. 21 and 24), oval shapes (FIGS. 22 and 23), rectangular shapes, hexagonal shapes, octagonal shapes, or the like.

In the embodiments shown in FIGS. 17 through 24, a same conductive pad 58A is underlying and physically contacting a plurality conductive bumps 60A. Also, each of the plurality of conductive bumps 60A has an overlying electrical connector 72 (FIG. 16) bonding to it. Accordingly, in the embodiments as shown in FIGS. 17 through 24, in a same multi-bump bonding structure 100, conductive bumps 60A are separated, while conductive pad 58A, bent conductive trace 69, conductive pad 58C (if any), and via 56A are shared by the separated conductive bumps 60A. In accordance with alternative embodiments, as shown in FIGS. 25 through 30, in a multi-bump bonding structure 100, there are two or more sets of conductive paths, each comprising a conductive bump 60A, a conductive pad 58A, a bent conductive trace 69, and a via 5A. There may be, or may not be, a conductive pad 58C in each set of the conductive paths. The plurality of conductive paths are connected to the same RDL 44. Alternatively stated, in the embodiments as shown in FIGS. 25 through 30, in a same multi-bump bonding structure 100, all of conductive bumps 60A, conductive pads 58A, bent conductive traces 69, conductive pads 58C (if any), and vias 56A may be duplicated, and may be connected to the same RDL 44. In the embodiments shown in FIGS. 25 through 30, bent conductive traces 69 also have the function of redistributing stress.

In accordance with some embodiments, two illustrated bent conductive traces 69 are parallel to each other and curve to the same direction, as shown in the shown in FIGS. 25 through 30. The corresponding sections of two or more bent conductive traces 69 may be, or may not be, parallel to each other. In accordance with other embodiments, the plurality of bent conductive traces 69 in the same multi-bump bonding structure 100 may have different shapes, different tilt angles, different curving directions, and/or the like.

Figure 25:
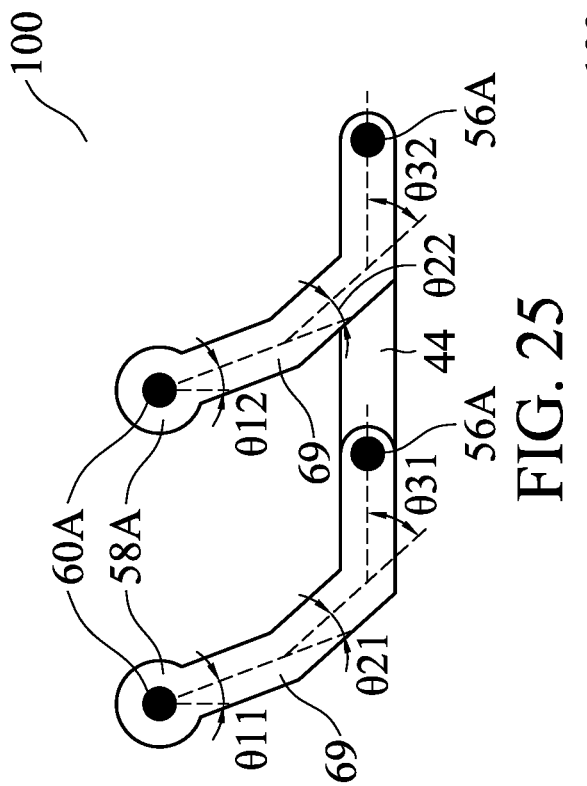
Figure 26:
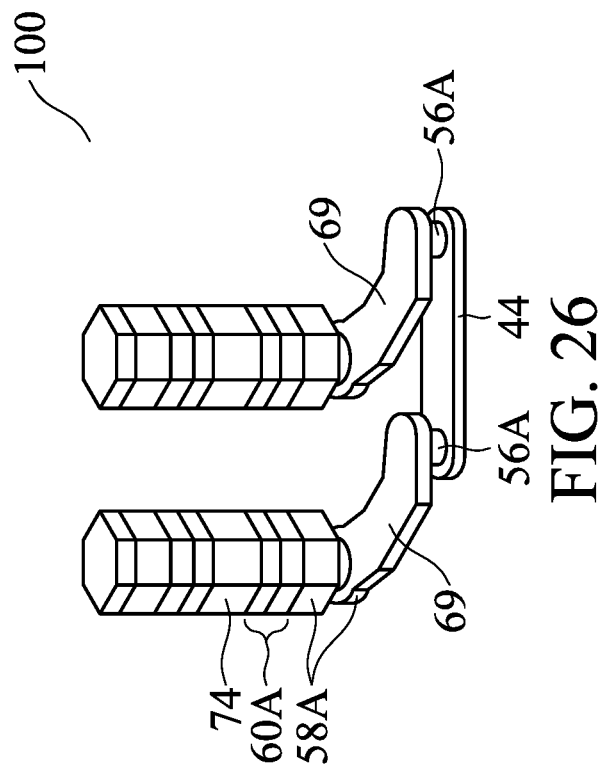
Figure 27:
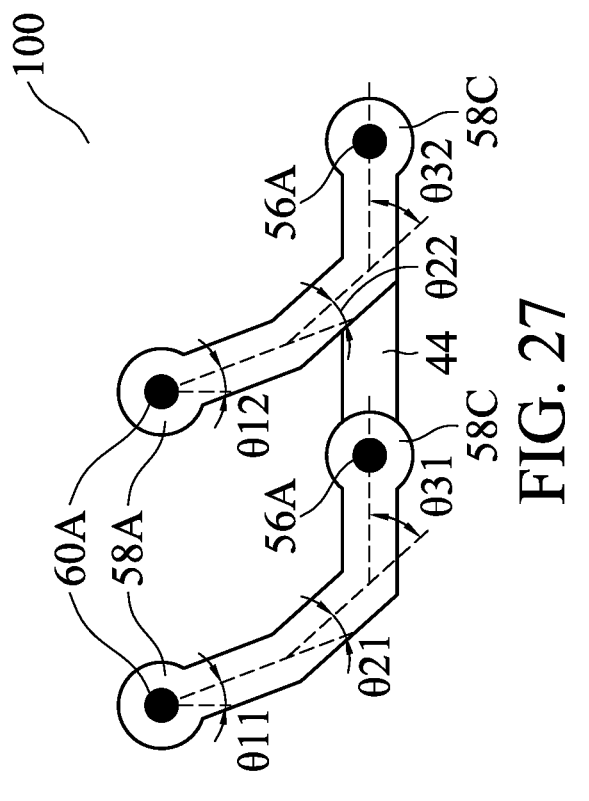
Figure 28:
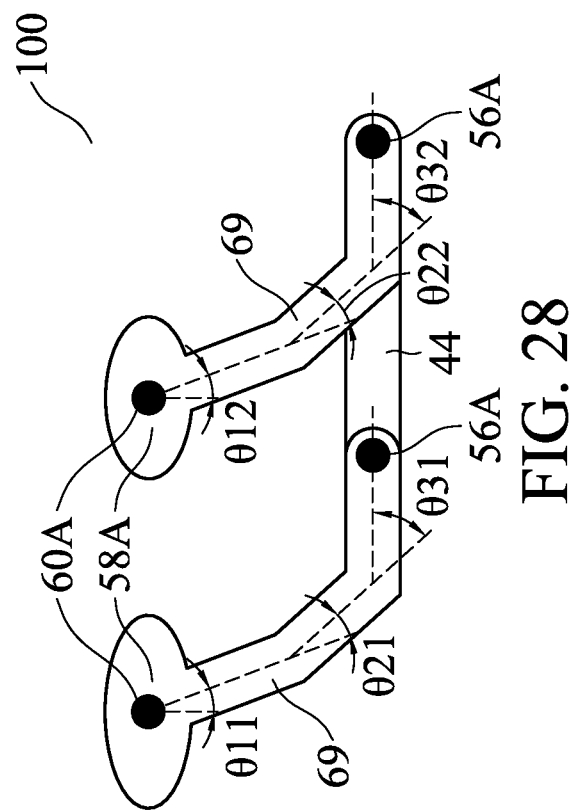
Figure 29:
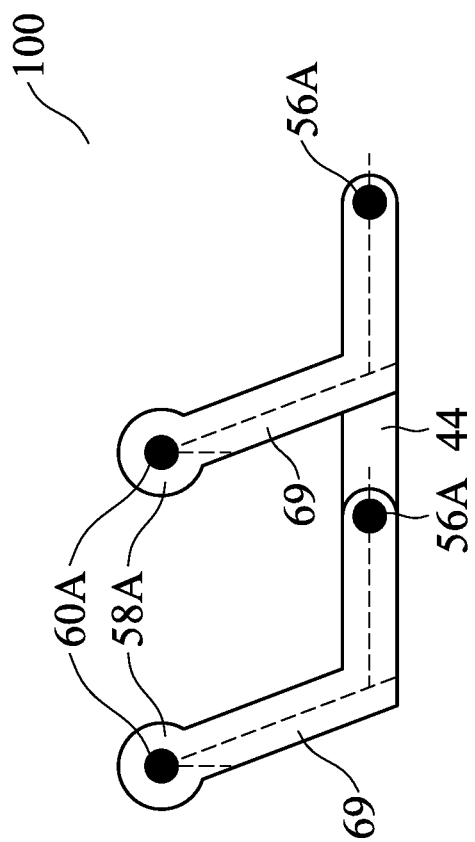
Figure 30:
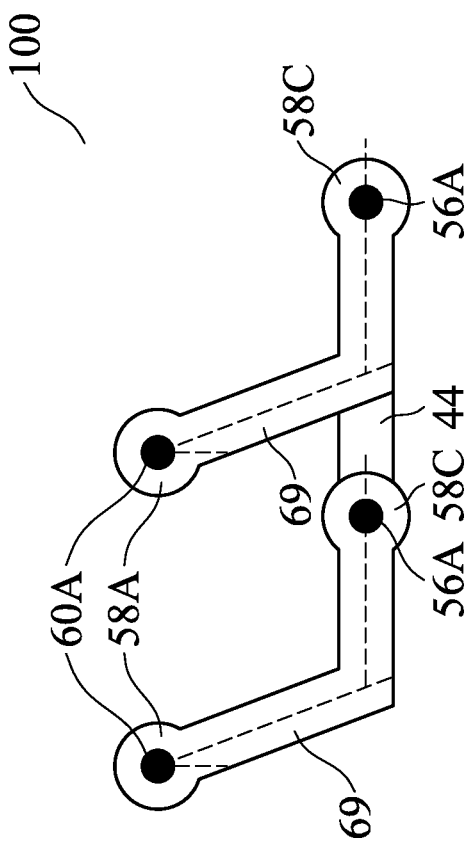

FIG. 25 illustrates a top view of multi-bump bonding structure 100, in which each of bent conductive traces 69 has three sections, and there is no conductive pad directly over vias 56A. FIG. 26 schematically illustrates a perspective view of the structure shown in FIG. 25. FIG. 27 illustrates a top view of multi-bump bonding structure 100, in which a conductive pad 58C is formed over each of vias 56A. FIG. 28 illustrates a top view of multi-bump bonding structure 100, in which conductive pads 58A have oval shapes. FIG. 29 illustrates a top view of multi-bump bonding structure 100, in which bent conductive traces 69 have two sections, and there are no conductive pads over vias 56A, and vias 56A are in direct contact with the overlying bent conductive traces 69. In FIGS. 2, 27, and 29, tilt angles $\theta 11$ and $\theta 12$ are marked to distinguish the tilt angles of two bent conductive traces 6A from each other. Furthermore, tilt angles $\theta 21$ and $\theta 22$ are marked to distinguish the tilt angles of two bent conductive traces 69 from each other, and tilt angles $\theta 31$ and $\theta 32$ are marked to distinguish the tilt angles of two bent conductive traces 6A from each other. FIG. 30 illustrates a top view of multi-bump bonding structure 100, in which bent conductive trace 69 have two sections, and there are conductive pads 58C over vias 56A.

Referring back to FIG. 16, there are some single-bump bonding structures 102, in which vias 56B are directly underlying and overlapped by the overlying conductive pad 58B, and there are no bent RDLs connecting the vias 56 to the corresponding conductive pads 58. Accordingly, the force from the conductive bumps 60B and conductive pads 58B are directly applied to the corresponding underlying RDLs 44. Since there is a single set of conductive bump 60B and conductive pad 58B, the applied force is smaller, and hence no bend RDL is used for reducing the stress.

In accordance with some embodiments, all of the multi-bump bonding structures (including two or more conductive bumps) in the package 80' will adopt the embodiments of the present disclosure, wherein bent conductive traces (RDLs) are used, to redistribute stress. On the other hand, throughout the package 80', single-bump bonding structures may or may not adopt bent conductive traces.

In accordance with some embodiments, multi-bump bonding structures 100 include multi-bump bonding structure 100A and multi-bump bonding structure 100B. The two conductive bumps 60 in multi-bump bonding structure 100A are directly underlying and connected to a same package component 70, wherein a bent conductive trace(s) 69 (FIGS. 21-30) is adopted. The two conductive bumps 60 in multi-bump bonding structure 100B are directly underlying and connected to two neighboring package component 70, wherein bent conductive trace(s) 69 (FIGS. 21-30) is adopted. In single-bump bonding structure 102 in accordance with these embodiments, however, no bent conductive traces 69 are adopted, and the via(s) 56 are directly underlying the corresponding conductive pad.

In the example embodiments as provided above, the multi-bump bonding structures are formed in a build-up substrate. In accordance with alternative embodiments, the multi-bump bonding structures may be formed in an interposer, which may include a semiconductor substrate and through-vias in the semiconductor substrate. For example, when RDLs are formed for the interposer after the backside polishing for revealing through-vias, the multi-bump bonding structures may be formed as parts of the RDLs of the interposer. In accordance with yet alternative embodiments, the multi-bump bonding structures may be formed in a Chip-on-Wafer-on-Substrate (CoWoS) package, wherein the multi-bump bonding structures may be formed in either or both of the wafer and the package substrate. In accordance with yet alternative embodiments, the multi-bump bonding structures may be formed in a fan-out package, wherein the multi-bump bonding structures may be formed in the fan-out RDLs, which are formed after the molding of device dies.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming bent conductive traces (RDLs) in multi-bump bonding structures, the high force applied by the multiple conductive bumps and conductive pads may be redistributed by the bent conductive traces, and the possibility of the line breaking and delamination of RDLs is reduced.

In accordance with some embodiments of the present disclosure, a method comprises forming a first package component comprising forming a first dielectric layer; patterning the first dielectric layer to form an opening; forming a first redistribution line comprising a first via in the opening; a first conductive pad, wherein the first via is vertically offset from the first conductive pad; and a first bent trace, wherein the first conductive pad and the first bent trace are over the first dielectric layer, and wherein the first bent trace connects the first conductive pad to the first via, and the first bent trace comprises a first plurality of sections with lengthwise directions un-parallel to each other; and forming a first conductive bump on the first conductive pad. In an embodiment, the first redistribution line and the first conductive bump are formed using a same seed layer and separate plating masks. In an embodiment, the method further comprises forming a second redistribution line comprising a second via extending into the first dielectric layer; a second conductive pad, wherein the second via is vertically offset from the second conductive pad; a second bent trace connecting the second conductive pad to the second via, wherein the second bent trace comprises a second plurality of sections, and both of the first via and the second via contact a top surface of a third redistribution line underlying the first dielectric layer; and forming a second conductive bump on the second conductive pad. In an embodiment, the method further comprises forming a second conductive bump on the first conductive pad, wherein both of the first conductive bump and the second conductive bump have bottom surfaces in contact with a top surface of the first conductive pad. In an embodiment, the method further comprises bonding a second package component to the first package component, with a first electrical connector and a second electrical connector of the second package component being bonded to the first conductive bump and the second conductive bump, respectively. In an embodiment, the method further comprises forming an addition conductive pad over and physically contacting the first via, wherein the addition conductive pad, the first bent trace, and the first conductive pad are continuously connected to each other without distinguish interfaces therebetween. In an embodiment, the first bent trace has a uniform width, and extends to directly over and contacting the first via.

In accordance with some embodiments of the present disclosure, a structure comprises a dielectric layer; a first via extending into the dielectric layer; a first conductive trace over the dielectric layer, wherein the first conductive trace comprises a first plurality of sections, with lengthwise directions of neighboring ones of the plurality of sections forming non-zero angles; a first conductive pad over the dielectric layer, wherein the first conductive trace electrically connects the first conductive pad to the first via, and the first conductive pad, the first conductive trace, and the first via form a continuous conductive region; and a first conductive bump over and contacting the first conductive pad. In an embodiment, the structure further comprises a second conductive bump over and contacting the first conductive pad, wherein the first conductive bump and the second conductive bump are aligned to a straight line, and the first plurality of sections of the first conductive trace comprise a first section joining the first conductive pad, with a first lengthwise direction of the first section and the straight line forming a first angle greater than 0 degrees and smaller than 90 degrees. In an embodiment, the first plurality of sections of the first conductive trace further comprise a second section joining the first section, with a second lengthwise direction of the second section and the first lengthwise direction forming a second angle, and a complementary angle of the second angle is greater than 0 degrees and smaller than 90 degrees. In an embodiment, the first plurality of sections comprise three sections. In an embodiment, the first conductive pad is elongated, and the first conductive trace is connected to a middle section of the first conductive pad. In an embodiment, the structure further comprises a second via extending into the dielectric layer; a second conductive trace over the dielectric layer, wherein the second conductive trace comprises a second plurality of sections; a second conductive pad over the dielectric layer, wherein the second conductive trace electrically connects the second conductive pad to the second via; a second conductive bump over and contacting the second conductive pad; and an additional redistribution line underlying and contacting both of the first via and the second via. In an embodiment, the first plurality of sections are parallel to respective second plurality of sections. In an embodiment, at least two of the first plurality of sections are neither parallel nor perpendicular to the straight line.

In accordance with some embodiments of the present disclosure, a structure comprises a first package component comprising a dielectric layer; and a multi-bump bond structure comprising a conductive pad overlying and contacting the dielectric layer; and a first conductive bump and a second conductive bump over and contacting the conductive pad; a via extending into the dielectric layer, wherein the via is vertically offset from the conductive pad; and a conductive trace over the dielectric layer and electrically connecting the conductive pad to the via, wherein the conductive trace is bent, and includes a plurality of sections, and wherein neighboring ones the plurality of sections are neither parallel to nor perpendicular to each other; and a second package component comprising a first conductive pad over and bonding to the first conductive bump; and a second conductive pad over and bonding to the second conductive bump. In an embodiment, the structure further comprises a third conductive bump over and contacting the conductive pad, wherein the second package component further comprising a third conductive pad over and bonding to the third conductive bump. In an embodiment, the structure further comprises a plurality of multi-bump bond structures comprising the multi-bump bond structure, wherein all of the multi-bump bond structures in the first package component comprise bent traces interconnecting corresponding conductive pads and corresponding vias, with the corresponding vias vertically offset from the corresponding conductive pads. In an embodiment, the first conductive bump and the second conductive bump are physically joined to the conductive pad without forming distinguishable interfaces. In an embodiment, the plurality of sections comprise three sections.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first package component comprising:
   forming a first dielectric layer;
   patterning the first dielectric layer to form an opening;
   forming a first redistribution line comprising:
   a first via in the opening;
   a first conductive pad, wherein the first via is vertically offset from the first conductive pad; and
   a first bent trace, wherein the first conductive pad and the first bent trace are over the first dielectric layer, and wherein the first bent trace connects the first conductive pad to the first via, and the first bent trace comprises a first plurality of sections with lengthwise directions un-parallel to each other, and wherein the first plurality of sections are at a same level; and
   forming a first conductive bump on the first conductive pad.

2. The method of claim 1, wherein the first redistribution line and the first conductive bump are formed using a same seed layer and separate plating masks.

3. The method of claim 1 further comprising forming a second redistribution line comprising:
   a second via extending into the first dielectric layer;
   a second conductive pad, wherein the second via is vertically offset from the second conductive pad;
   a second bent trace connecting the second conductive pad to the second via, wherein the second bent trace comprises a second plurality of sections, and both of the first via and the second via contact a top surface of a third redistribution line underlying the first dielectric layer; and
   forming a second conductive bump on the second conductive pad.

4. The method of claim 1 further comprising forming a second conductive bump on the first conductive pad, wherein both of the first conductive bump and the second conductive bump have bottom surfaces in contact with a top surface of the first conductive pad.

5. The method of claim 1, wherein bottom surfaces of the first plurality of sections are in contact with a same top surface of the first dielectric layer.

6. The method of claim 1 further comprising forming an addition conductive pad over and physically contacting the first via, wherein the addition conductive pad, the first bent trace, and the first conductive pad are continuously connected to each other without distinguish interfaces therebetween.

7. The method of claim 1, wherein the first bent trace has a uniform width, and extends to directly over and contacting the first via.

8. A method comprising:
   forming a dielectric layer comprising a top surface;
   forming a first via extending into the dielectric layer;
   in a first plating process, forming a first conductive trace over the dielectric layer, wherein the first conductive trace comprises a first plurality of sections, with lengthwise directions of neighboring ones of the first plurality of sections forming non-zero angles, and wherein bottom surfaces of the first plurality of sections are in contact with the top surface of the dielectric layer to form a horizontal interface;
   in the first plating process, further forming a first conductive pad, wherein the first conductive trace electrically connects the first conductive pad to the first via, and wherein the first conductive pad, the first conductive trace, and the first via form a continuous conductive region; and
   performing a second plating process to form a first conductive bump over and contacting the first conductive pad.

9. The method of claim 8, further comprising forming a second conductive bump over and contacting the first conductive pad, wherein the first conductive bump and the second conductive bump are aligned to a straight line, and the first plurality of sections of the first conductive trace comprise a first section joining the first conductive pad, with a first lengthwise direction of the first section and the straight line forming a first angle greater than 0 degrees and smaller than 90 degrees.

10. The method of claim 9, wherein at least two of the first plurality of sections are neither parallel nor perpendicular to the straight line.

11. The method of claim 9, wherein the first plurality of sections of the first conductive trace further comprise a second section joining the first section, with a second lengthwise direction of the second section and the first lengthwise direction forming a second angle, and a complementary angle of the second angle is greater than 0 degrees and smaller than 90 degrees.

12. The method of claim 8, wherein the bottom surfaces of the first plurality of sections are continuously connected to form a continuous interface.

13. The method of claim 8, wherein the first conductive pad is elongated, and the first conductive trace is connected to a middle section of the first conductive pad.

14. The method of claim 8 further comprising:
forming a second via extending into the dielectric layer;
forming a second conductive trace over the dielectric layer, wherein the second conductive trace comprises a second plurality of sections, and wherein bottom surfaces the second plurality of sections are also in physical contact with the top surface of the dielectric layer;
forming a second conductive pad over the dielectric layer, wherein the second conductive trace electrically connects the second conductive pad to the second via;
forming a second conductive bump over and contacting the second conductive pad; and
forming an additional redistribution line underlying and contacting both of the first via and the second via.

15. The method of claim 14, wherein the first plurality of sections are parallel to respective second plurality of sections.

16. A method comprising:
forming a first package component comprising:
  forming a dielectric layer;
  forming a via extending into the dielectric layer;
  forming a conductive trace over the dielectric layer, wherein the conductive trace is bent, and includes a plurality of sections, and wherein neighboring ones the plurality of sections are neither parallel to nor perpendicular to each other, and wherein bottom surfaces the plurality of sections are in physical contact with a same top surface of the dielectric layer; and
  forming a multi-bump bond structure comprising:
    in a same process for forming the conductive trace, forming a conductive pad overlying and contacting the dielectric layer, wherein the via is vertically offset from the conductive pad, and wherein the conductive pad is electrically connected to the via through the conductive trace; and
    forming a first conductive bump and a second conductive bump over and contacting the conductive pad; and
forming a second package component comprising:
  plating a first conductive pad over and bonding to the first conductive bump; and
  plating a second conductive pad over and bonding to the second conductive bump.

17. The method of claim 16 further comprising forming a third conductive bump over and contacting the conductive pad, wherein the second package component further comprises a third conductive pad over and bonding to the third conductive bump.

18. The method of claim 16 further comprising forming a plurality of multi-bump bond structures comprising the multi-bump bond structure, wherein all of the multi-bump bond structures in the first package component comprise bent traces interconnecting corresponding conductive pads and corresponding vias, with the corresponding vias vertically offset from the corresponding conductive pads.

19. The method of claim 16, wherein the first conductive bump and the second conductive bump are physically joined to the conductive pad without forming distinguishable interfaces.

20. The method of claim 16, wherein the plurality of sections comprise three sections.

* * * * *